US012787553B2

(12) United States Patent
Park et al.

(10) Patent No.: US 12,787,553 B2
(45) Date of Patent: Nov. 3, 2026

(54) DISPLAY PANEL HAVING BARRIER WALL AND METHOD OF PROVIDING THE SAME

(71) Applicant: Samsung Display Co., Ltd., Yongin-si (KR)

(72) Inventors: Joonyong Park, Yongin-si (KR); Hyuneok Shin, Yongin-si (KR); Sukyoung Yang, Yongin-si (KR); Dongmin Lee, Yongin-si (KR); Yung Bin Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 362 days.

(21) Appl. No.: 18/425,686

(22) Filed: Jan. 29, 2024

(65) Prior Publication Data

US 2024/0365596 A1 Oct. 31, 2024

(30) Foreign Application Priority Data

Apr. 25, 2023 (KR) ........................ 10-2023-0054313

(51) Int. Cl.
*H10K 59/122* (2023.01)
*H10K 59/12* (2023.01)

(52) U.S. Cl.
CPC ....... *H10K 59/122* (2023.02); *H10K 59/1201* (2023.02)

(58) Field of Classification Search
None
See application file for complete search history.

(56) References Cited

U.S. PATENT DOCUMENTS

| | | | | |
|---|---|---|---|---|
| 10,879,316 | B2 | 12/2020 | Lee et al. | |
| 11,348,983 | B1 | 5/2022 | Choung et al. | |
| 2019/0058020 | A1* | 2/2019 | Tsai | G06F 3/0412 |
| 2021/0066419 | A1* | 3/2021 | Byun | H10K 59/122 |
| 2021/0327981 | A1* | 10/2021 | Lee | H10K 59/122 |
| 2022/0077252 | A1 | 3/2022 | Choung et al. | |
| 2022/0190295 | A1 | 6/2022 | Son et al. | |
| 2022/0344417 | A1* | 10/2022 | Choung | H10K 59/173 |

FOREIGN PATENT DOCUMENTS

| | | | |
|---|---|---|---|
| KR | 20200091059 | A | 7/2020 |
| KR | 1020220085110 | A | 6/2022 |

* cited by examiner

*Primary Examiner* — Khaja Ahmad
(74) *Attorney, Agent, or Firm* — CANTOR COLBURN LLP

(57) ABSTRACT

A display panel includes a pixel defining layer in which a light emitting opening is defined, a barrier wall which is on the pixel defining layer and electrically conductive, the barrier wall including a first lower layer which is electrically conductive, a first upper layer which faces the first lower layer and is electrically conductive, a second lower layer between the first lower layer and the first upper layer, the second lower layer defining an opening therein which is adjacent to the light emitting opening, and the first upper layer electrically connected to the first lower layer through the opening of the second lower layer, and a light emitting element including a first electrode, an emission pattern and a second electrode in the light emitting opening, and the second electrode contacting the first lower layer of the barrier wall.

21 Claims, 25 Drawing Sheets

DISPLAY PANEL HAVING BARRIER WALL AND METHOD OF PROVIDING THE SAME

This application claims priority to Korean Patent Application No. 10-2023-0054313 filed on Apr. 25, 2023, and all the benefits accruing therefrom under 35 U.S.C. § 119, the disclosures of which are incorporated by reference herein in their entireties.

BACKGROUND

(1) Field

Embodiments of the present disclosure described herein relate to a display panel and a method of manufacturing (or providing) the same. More particularly, embodiments relate to a display panel having improved process reliability and a method of manufacturing (or providing) thereof.

(2) Description of the Related Art

A display device is activated depending on an electrical signal. The display device may include a display panel that displays an image. In the display panel, an organic light emitting display panel has low power consumption, high luminance, and high response speed.

The organic light emitting display panel includes anodes, cathodes, and emission patterns. The emission patterns are separated for respective emissive regions, and the cathodes provide a common voltage to the emissive regions.

SUMMARY

Embodiments of the present disclosure provide a light emitting element formed (or provided) without using a metal mask, a display panel including the light emitting element provided without using the metal mask, and a method for manufacturing (or providing) the display panel.

According to an embodiment, a display panel includes a pixel defining layer in which a light emitting opening is defined, a barrier wall which is on the pixel defining layer and is electrically conductive, and a light emitting element, the barrier wall includes a first lower layer which is electrically conductive, a first upper layer which faces the first lower layer and is electrically conductive, a second lower layer between the first lower layer and the first upper layer, the second lower layer defining an opening therein and the first upper layer electrically connected to the first lower layer through the opening of the second lower layer, the light emitting element includes a first electrode, an emission pattern and a second electrode in the light emitting opening and the second electrode contacting the first lower layer of the barrier wall.

The first lower layer may include a first lower side surface, the second lower layer may include a second lower side surface, the first lower side surface and the second lower side surface may define portions of a barrier wall opening of the barrier wall which corresponds to the light emitting opening, and the first lower side surface may be recessed from the second lower side surface in a direction away from the light emitting opening.

The second lower layer may include an inorganic material.

The second lower layer may further include an exposed lower surface extended from the first lower side surface which is recessed, and the display panel may further include an inorganic pattern covering the second electrode, the first lower side surface and an entirety of the exposed lower surface.

The second electrode may contact the first lower side surface.

The barrier wall may further include a second upper layer which faces the second lower layer with the first upper layer therebetween.

The first lower layer and the first upper layer may include a same metal material.

Each of the first lower layer and the first upper layer may include molybdenum.

The first upper layer may include a first upper side surface, the second upper layer may include a second upper side surface, the first upper side surface and the second upper side surface may define portions of the barrier wall opening, and the first upper side surface may be recessed from the second upper side surface in the direction away from the light emitting opening.

The second lower layer may define a first tip portion of the barrier wall which protrudes further than the first lower side surface, and the second upper layer may define a second tip portion of the barrier wall which protrudes further than the first upper side surface.

The second upper layer may include an inorganic material.

The second lower layer and the second upper layer may include different inorganic materials from each other.

A length by which the second tip portion protrudes from the first upper side surface may be greater than a length by which the first tip portion protrudes from the first lower side surface.

The first lower layer and the first upper layer may include different metallic materials from each other.

The first lower side surface may be recessed from the first upper side surface in the direction away from the light emitting opening.

A length by which the first tip portion protrudes from the first lower side surface may be greater than a length by which the second tip portion protrudes from the first upper side surface.

The first upper layer may include aluminum), and the first lower layer may include an aluminum) alloy.

Each of the second lower layer and the second upper layer may include titanium.

The first tip portion may include an exposed lower surface of the second lower layer which is extended from the first lower side surface, the second tip portion may include an exposed lower surface of the second upper layer which is extended from the first upper side surface, and the display panel may further include an inorganic pattern covering the second electrode, an entirety of the first lower side surface, an entirety of the exposed lower surface of the first tip portion and an entirety of the exposed lower surface of the second tip portion.

The second upper layer may define a depression recessed from an upper surface of the second upper layer, the depression corresponding to the opening defined in the second lower layer.

The display panel may further include in the light emitting opening of the pixel defining layer, a sacrificial pattern which is on the first electrode and in which a sacrificial opening is defined, the sacrificial opening corresponding to the light emitting opening, the pixel defining layer may cover the sacrificial pattern.

According to an embodiment, a method for manufacturing a display panel includes providing a preliminary display panel including a first electrode of a light emitting element, and a preliminary pixel defining layer covering the first electrode, providing, on the preliminary pixel defining layer, a preliminary first lower layer and a preliminary second lower layer of a barrier wall, providing an opening in the preliminary second lower layer, providing, on the preliminary second lower layer defining the opening therein, a preliminary first upper layer of the barrier wall which is electrically connected with the preliminary first lower layer through the opening, patterning the preliminary first upper layer, the preliminary second lower layer and the preliminary first lower layer to provide a barrier wall opening of the barrier wall having a first upper layer, a second lower layer and a first lower layer, respectively, the barrier wall opening corresponding to the first electrode of the light emitting element and exposing the first electrode to outside the barrier wall, providing an emission pattern of the light emitting element, on the first electrode which is exposed, and providing, on the emission pattern, a second electrode of the light emitting element which contacts the barrier wall at the first lower layer.

The method may further include providing, on the preliminary first upper layer, a preliminary second upper layer. The patterning may include a first etching of the preliminary first lower layer, the preliminary second lower layer, the preliminary first upper layer and the preliminary second upper layer, to provide an etched first lower layer, the second lower layer of the barrier wall, an etched first upper layer and the second upper layer of the barrier wall, respectively, and a second etching of the etched first lower layer and the etched first upper layer, to provide the first lower layer and a first upper layer, respectively, of the barrier wall.

A material of the second lower layer may have a higher etch rate than a material of the second upper layer.

The first etching may include defining a second lower side surface of the second lower layer, a second upper side surface of the second upper layer, the second lower side surface and the second upper side surface respectively defining portions of the barrier wall opening, and in a direction along the first electrode, the barrier wall opening at the second lower side surface being larger than the barrier wall opening at the second upper side surface.

A material of the first lower layer may have a higher etch rate than a material of the first upper layer.

The second etching may include defining a first lower side surface of the first lower layer, a first upper side surface of the first upper layer, the first lower side surface and the first upper side surface respectively defining portions of the barrier wall opening, and in a direction along the first electrode, the barrier wall opening at the first lower side surface being larger than the barrier wall opening at the first upper side surface.

The providing of the preliminary first upper layer on the preliminary second lower layer defining the opening therein together with the providing of the preliminary second upper layer on the preliminary first upper layer, may provide a depression recessed from an upper surface of the preliminary second upper layer, the depression corresponding to the opening defined in the preliminary second lower layer.

The providing of the opening in the preliminary second lower layer may include a dry etch process.

The method may further include providing an inorganic pattern covering the second electrode, after the providing of the second electrode.

The method may further include patterning the preliminary pixel defining layer to provide a pixel defining layer and a light emitting opening which is defined therein and corresponds to the barrier wall opening, before the providing of the emission pattern on the first electrode.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1A:
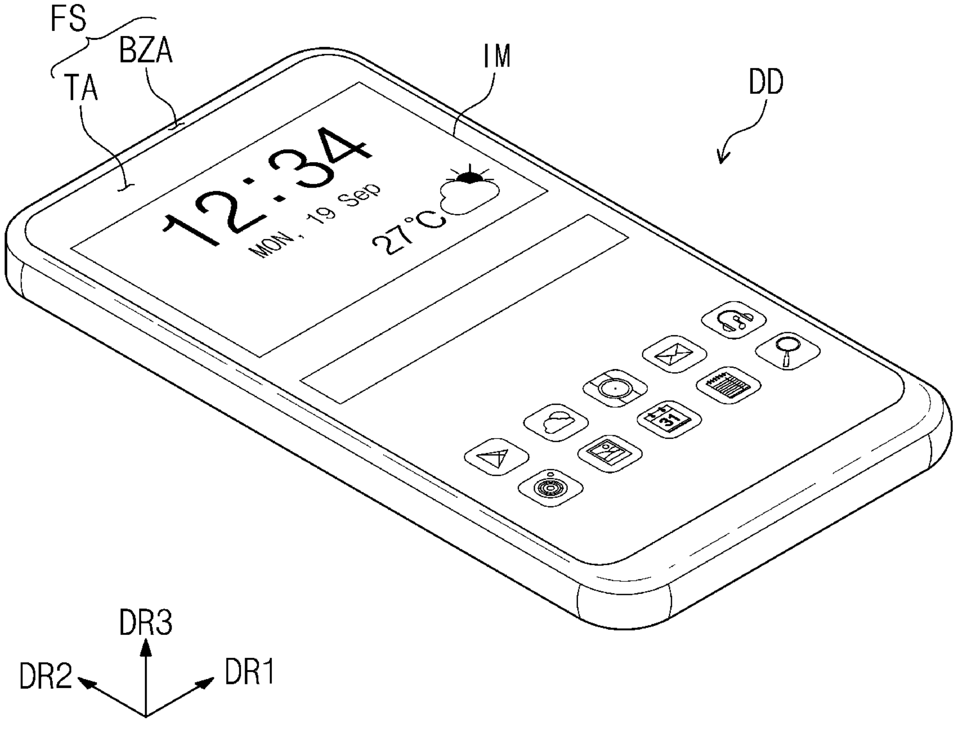
FIG. 1A is a perspective view of a display device according to an embodiment of the present disclosure.

Various changes can be made to the present disclosure, and various embodiments of the present disclosure may be implemented. Thus, specific embodiments are illustrated in the drawings and described as examples herein. However, it should be understood that the present disclosure is not to be construed as being limited thereto and covers all modifications, equivalents, and alternatives falling within the spirit and scope of the present disclosure.

In this specification, when it is mentioned that a component (or, an area, a layer, a part, etc.) is referred to as being related to another element such as being “on,” “connected to” or “coupled to” another component, this means that the component may be directly on, connected to, or coupled to the other component or a third component may be present therebetween. In contrast, when it is mentioned that a component (or, an area, a layer, a part, etc.) is related to another element such as being “directly on,” “directly connected to” or “directly coupled to” another component, this means that no third component is present therebetween.

Like reference numerals refer to like components. For example, within the Figures and the text of the disclosure, a reference number indicating a singular form of an element may also be used to reference a plurality of the singular element. Additionally, in the drawings, the thicknesses, proportions, and dimensions of components are exaggerated for effective description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

It should be understood that terms such as "comprise," "include" and "have" when used herein, specify the presence of stated features, numbers, steps, operations, components, parts, or combinations thereof, but do not preclude the presence or addition of one or more other features, numbers, steps, operations, components, parts, or combinations thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the accompanying drawings.

Figure 1B:
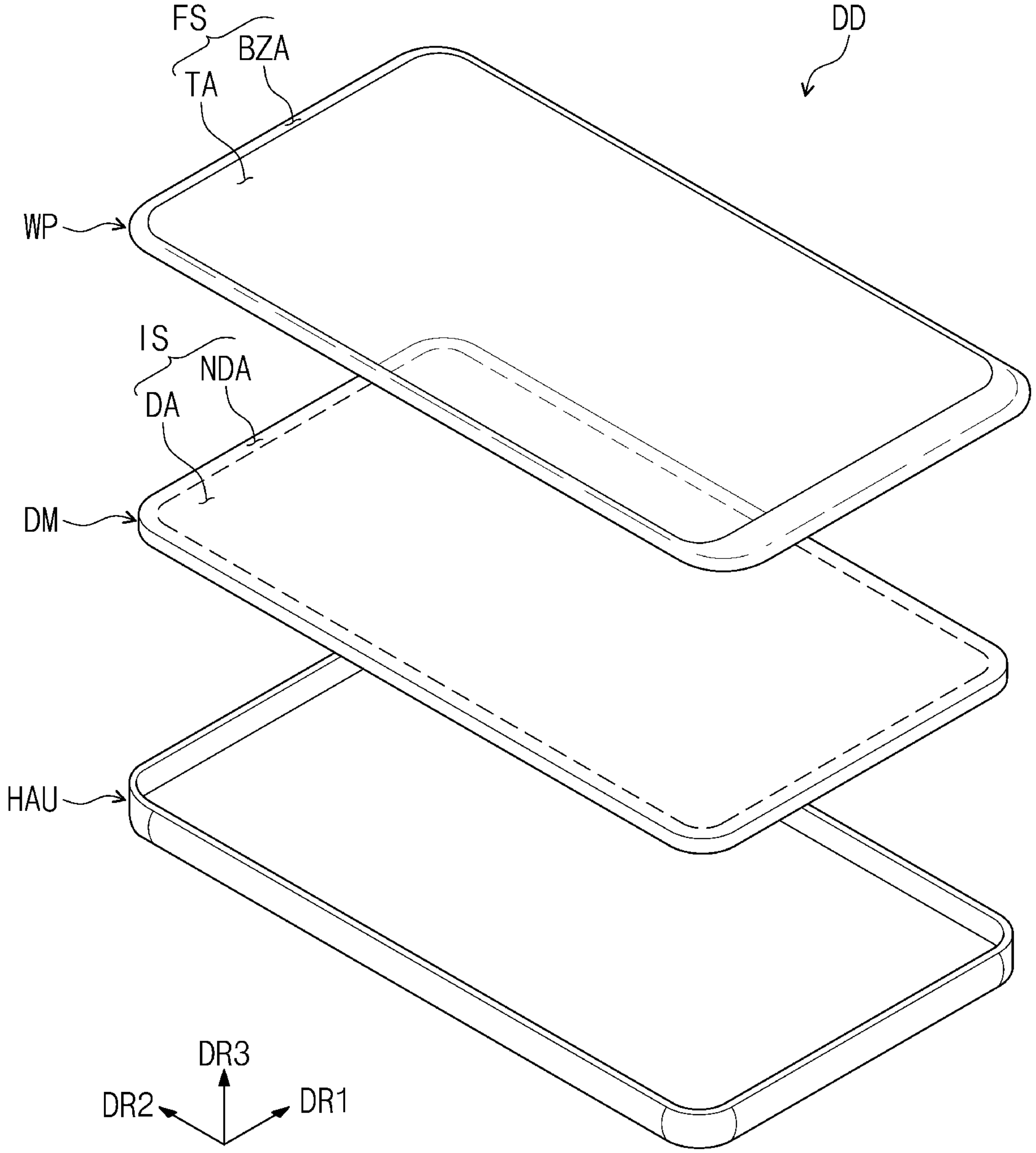
FIG. 1B is an exploded perspective view of the display device according to an embodiment of the present disclosure.
Figure 2:
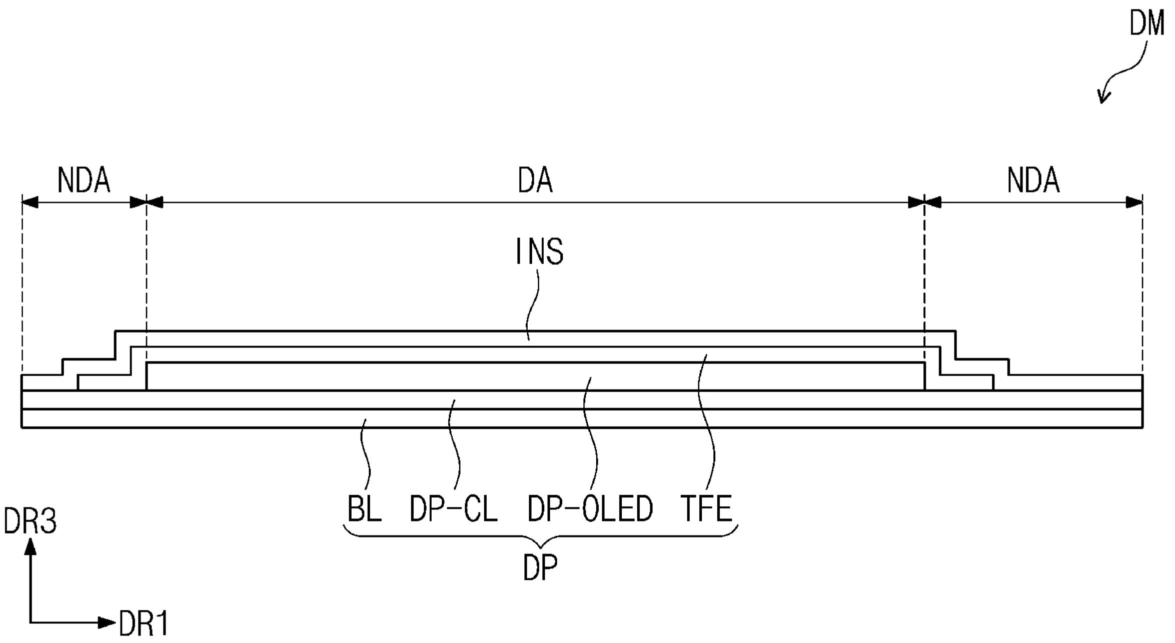
FIG. 2 is a cross-sectional view of a display module according to an embodiment of the present disclosure.

FIG. 1A is a perspective view of a display device DD according to an embodiment of the present disclosure. FIG. 1B is an exploded perspective view of the display device DD according to an embodiment of the present disclosure. FIG. 2 is a sectional view (e.g., a cross-sectional view) of a display module DM according to an embodiment of the present disclosure.

In an embodiment, the display device DD may be a large electronic device such as a television, a monitor, or a billboard. In addition, the display device DD may be a small and medium-sized electronic device such as a personal computer, a notebook computer, a personal digital terminal, a car navigation unit, a game machine, a smart phone, a tablet computer, or a camera. However, these devices are merely illustrative, and the display device DD may be employed as other display devices without departing from the spirit and scope of the present disclosure. In this embodiment, the display device DD is illustrated as a smart phone.

Referring to FIGS. 1A, 1B, and 2, the display device DD may display an image IM in a third direction DR3 on (or at) a display surface FS parallel to a plane defined by a first direction DR1 and a second direction DR2 crossing each other. The image IM may include a still image as well as a dynamic image. In FIG. 1A, a clock window and icons are illustrated as examples of the image IM. The display surface FS on which the image IM is displayed may correspond to a front surface of the display device DD.

In this embodiment, front surfaces (or, upper surfaces) and rear surfaces (or, lower surfaces) of members are defined based on the direction in which the image IM is displayed. The front surfaces and the rear surfaces may face away from each other in the third direction DR3, and normal directions of the front surfaces and the rear surfaces may be parallel to the third direction DR3. The directions indicated by the first to third directions DR1, DR2, and DR3 may be relative concepts and may be changed to different directions. As used herein, the expression "from above a plane" may mean that it is viewed in the third direction DR3. A thickness of the display device DD and various components or layers thereof may be defined along the third direction DR3 (e.g., a thickness direction), As illustrated in FIG. 1B, the display device DD according to this embodiment may include a window WP, a display module DM, and a housing HAU. The window WP and the housing HAU may be coupled with each other to form an exterior or outer surface of the display device DD.

The window WP may include an optically clear insulating material. For example, the window WP may include glass or plastic. A front surface of the window WP may define the display surface FS of the display device DD. The display surface FS may include a transmissive region TA and a bezel region BZA. The transmissive region TA may be an optically clear region. For example, the transmissive region TA may be a region having a visible light transmittance of about 90% or more.

The bezel region BZA may be a region having a lower light transmittance than the transmissive region TA. The bezel region BZA may define the shape (e.g., a planar shape) of the transmissive region TA in a plan view (e.g., a view along the third direction DR3). The bezel region BZA may be adjacent to the transmissive region TA and may surround the transmissive region TA in the plan view. In the window WP according to an embodiment of the present disclosure, the bezel region BZA may be omitted and the transmissive region TA may extend to the outer edge of the display device DD in the plan view. The window WP may include at least one of an anti-fingerprint layer, a hard coating layer and an anti-reflective layer and is not limited to any one embodiment.

The display module DM may be disposed under the window WP. The display module DM may be a component that substantially generates the image IM. The image IM generated by the display module DM is displayed on a display surface IS of the display module DM and visually recognized, such as by a user, from outside of the display device DD through the transmissive region TA.

The display module DM includes a display region DA and a non-display region NDA. The display region DA may be a region activated depending on an electrical signal. The non-display region NDA is adjacent to the display region DA. The non-display region NDA may surround the display region DA in a the plan view. The non-display region NDA may be a region corresponding to and covered by the bezel region BZA and may not be visible from the outside (e.g., the outside of the display device DD).

As illustrated in FIG. 2, the display module DM according to this embodiment may include a display panel DP as a display layer, and an input sensor INS as an input sensing layer. Although not separately illustrated, the display device DD according to an embodiment of the present disclosure may further include a protective member disposed on a lower surface of the display panel DP and an anti-reflector and/or a window member disposed on an upper surface of the input sensor INS.

The display panel DP may be an emissive display panel and is not particularly limited. For example, the display panel DP may be an organic light emitting display panel or an inorganic light emitting display panel. An emissive layer in the organic light emitting display panel includes an organic light emitting material. An emissive layer in the inorganic light emitting display panel includes a quantum dot, a quantum rod, or a micro light emitting diode (LED). Hereinafter, it will be exemplified that the display panel DP is an organic light emitting display panel.

The display panel DP may include a base layer BL, a circuit element layer DP-CL, a display element layer DP-OLED, and an encapsulation layer TFE. The circuit element layer DP-CL, the display element layer DP-OLED, and the encapsulation layer TFE may be disposed in order, on the base layer BL. The input sensor INS may be directly disposed on the encapsulation layer TFE. As used herein, the expression "component A is directly disposed on component B" means that a separate layer such as an adhesive layer is not disposed between component A and component B. Components or layers which are directly disposed on each other may contact each other such as to form an interface therebetween.

The base layer BL may include at least one plastic film of one layer of a plastic material. The base layer BL may be a flexible substrate and may include a plastic substrate, a glass substrate, a metal substrate, or an organic/inorganic composite substrate. In this specification, the display region DA and the non-display region NDA may be defined in the base layer BL, and components disposed on the base layer BL may be disposed to overlap the display region DA or the non-display region NDA. That is, various components or layers of the display module DM (or the display device DD) may have a display region DA and a non-display region NDA corresponding to those described above.

The circuit element layer DP-CL includes at least one insulating layer and a circuit element. The insulating layer includes at least one inorganic layer and at least one organic layer. The circuit element includes signal lines and a pixel drive circuit.

The display element layer DP-OLED includes a conductive barrier wall and a light emitting element ED. The light emitting element ED may include an anode, an emission pattern, and a cathode. The emission pattern may include at least an emissive layer. In an embodiment, the light emitting element ED may be connected to the circuit element layer DP-CL, such as at one or more of the signal line and the pixel drive circuit, without being limited thereto. That is, the circuit element layer DP-CL may be connected to the display element layer DP-OLED to emit light, generate the image IM, etc.

The encapsulation layer TFE includes a plurality of thin films. Some of the thin films are disposed to improve optical efficiency, and other thin films are disposed to protect organic light emitting diodes.

The input sensor INS obtains coordinate information of an external input to the display module DM and/or the display device DD. The input sensor INS may have a multi-layer structure. The input sensor INS may include a single conductive layer or multiple conductive layers. The input sensor INS may include a single insulating layer or multiple insulating layers. For example, the input sensor INS may sense an external input in a capacitive type. In the present disclosure, an operating method of the input sensor INS is not particularly limited, and in an embodiment of the present disclosure, the input sensor INS may sense an external input using an electromagnetic induction method or a pressure sensing method. Meanwhile, in an embodiment of the present disclosure, the input sensor INS may be omitted.

As illustrated in FIG. 1B, the housing HAU may be coupled with the window WP. The housing HAU may be coupled with the window WP to provide a predetermined inner space. The display module DM and other components or layers of the display device DD may be accommodated in the inner space.

The housing HAU may include a material having a relatively high rigidity. For example, the housing HAU may include glass, plastic, or metal, or may include a plurality of frames and/or plates formed (or provided) of a combination of the aforementioned materials. The housing HAU may stably protect components of the display device DD accommodated in the inner space from external impact.

Figure 3:
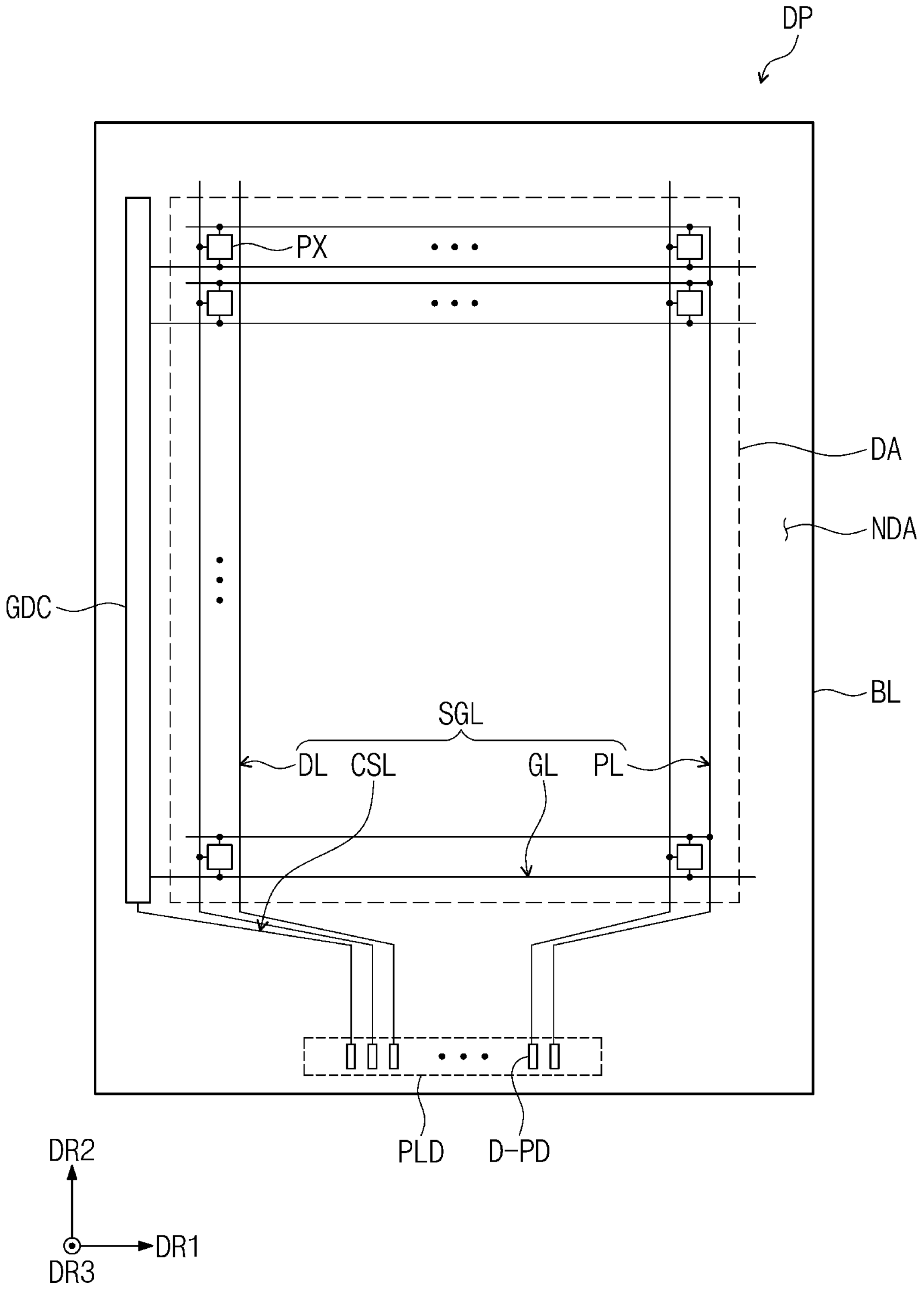
FIG. 3 is a plan view of a display panel according to an embodiment of the present disclosure.

FIG. 3 is a plan view of the display panel DP according to an embodiment of the present disclosure.

Referring to FIG. 3, the display panel DP may include the base layer BL divided into the display region DA and the non-display region NDA which are described with reference to FIG. 2.

The display panel DP may include a pixel PX provided in plural including a plurality of pixels PX disposed in the display region DA, and signal lines SGL electrically connected to the pixels PX at the display region DA. The display panel DP may include a drive circuit GDC and a pad part PLD (e.g., pad region) that are disposed in the non-display region NDA.

The pixels PX may be arranged in the first direction DR1 and/or the second direction DR2. The pixels PX may include a plurality of pixel rows that extend in the first direction DR1 and that are arranged in the second direction DR2, and a plurality of pixel columns that extend in the second direction DR2 and that are arranged in the first direction DR1.

The signal lines SGL may include gate lines GL, data lines DL, a power line PL, and a control signal line CSL. Each of the gate lines GL may be connected to a corresponding one of the pixels PX, and each of the data lines DL may be connected to a corresponding one of the pixels PX. The power line PL may be electrically connected to the pixels PX. The control signal line CSL may be connected to the drive circuit GDC and may provide electrical signals such as control signals to the drive circuit GDC.

The drive circuit GDC may include a gate drive circuit. The gate drive circuit may generate electrical signals such as gate signals and may sequentially output the generated gate signals to the gate lines GL. The gate drive circuit may additionally output other control signals to the pixel drive circuit.

The pad part PLD may be a part or planar area at which a flexible circuit board is connected to the display panel DP. The pad part PLD may include a pixel pad D-PD provided in plural including a plurality of pixel pads D-PD, and the pixel pads D-PD may be pads at which the flexible circuit board is connected to the display panel DP. Each of the pixel pads D-PD may be connected with a corresponding one of the signal lines SGL, at the non-display region NDA. The pixel pads D-PD as display pads may be connected to the corresponding pixels PX through the signal lines SGL. Furthermore, one pixel pad D-PD among the plurality of pixel pads D-PD may be connected to the drive circuit GDC.

In addition, the pad part PLD may further include input pads (not shown). The input pads may be pads at which a flexible circuit board is connected to the input sensor INS of the display module DM (refer to FIG. 2). However, without being limited thereto, the input pads may be disposed on the input sensor INS (refer to FIG. 2) and may be connected with the pixel pads D-PD and a separate circuit board. Alternatively, the input sensor INS (refer to FIG. 2) may be omitted, and the input pads may not be additionally included.

Figure 4:
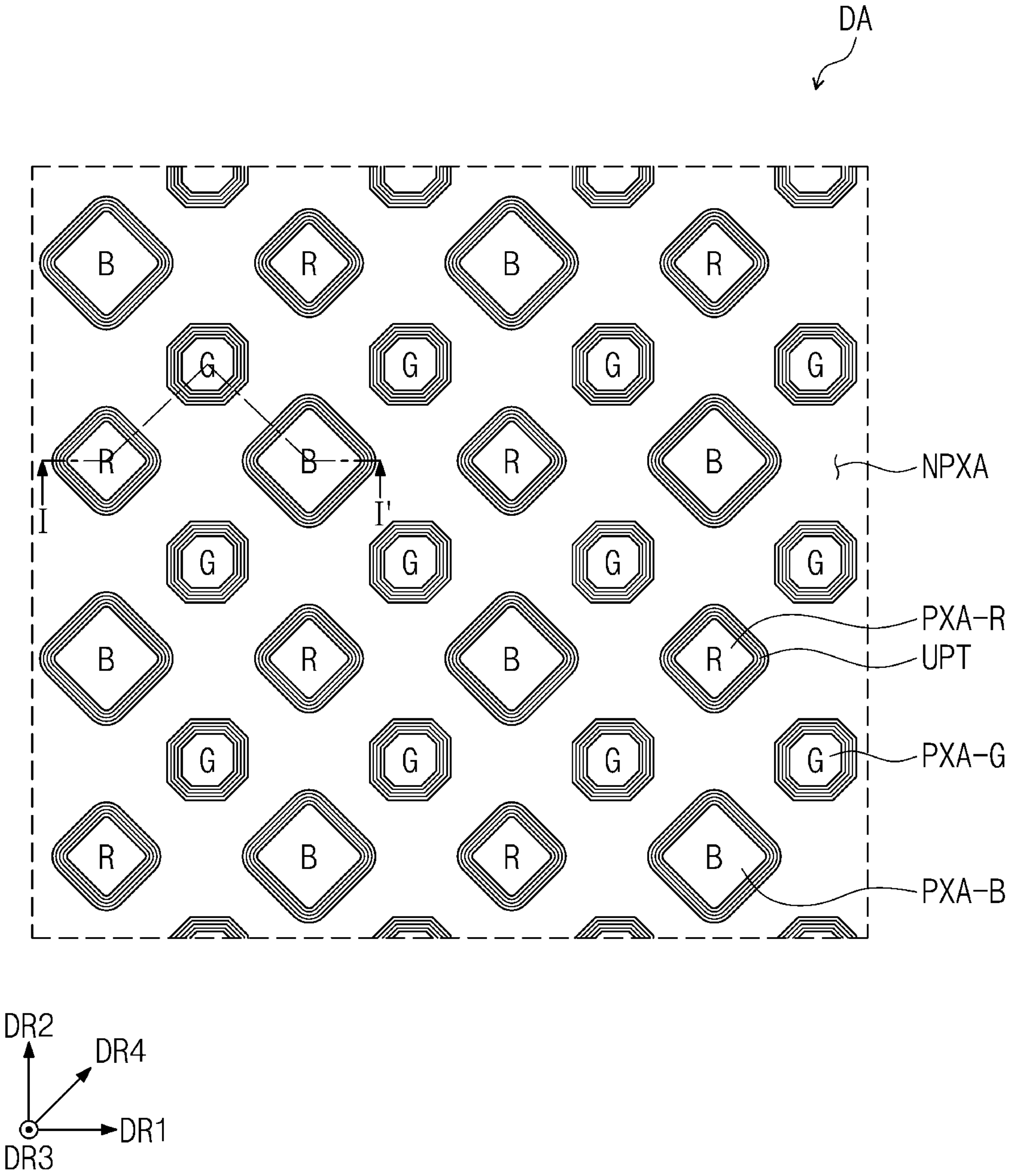
FIG. 4 is an enlarged plan view of a portion of a display region of the display panel according to an embodiment of the present disclosure.

FIG. 4 is an enlarged plan view of a portion of the display region DA of the display panel DP according to an embodiment of the present disclosure. FIG. 4 is a plan view of the display module DM (refer to FIG. 2) as viewed from above the display surface IS (refer to FIG. 2) of the display module DM (refer to FIG. 2) and illustrates an arrangement of a light emission region (or a light emitting region) provided in plural including a plurality of emissive regions PXA-R, PXA-G, and PXA-B and an upper pattern UPT.

Referring to FIG. 4, the display region DA may include the first to third emissive regions PXA-R, PXA-G, and PXA-B and a peripheral region NPXA which is adjacent to the first to third emissive regions PXA-R, PXA-G, and PXA-B. The peripheral region NPXA as a non-emissive region may surround the first to third emissive regions PXA-R, PXA-G, and PXA-B. The first to third emissive regions PXA-R, PXA-G, and PXA-B may correspond to regions or planar areas at which light provided from a light emitting element ED provided in plurality including a plurality of light emitting elements ED1, ED2, and ED3 (refer to FIG. 5) is respectively emitted. The first to third emissive regions PXA-R, PXA-G, and PXA-B may be distinguished from one another depending on the colors of light emitted toward the outside of the display module DM (refer to FIG. 2).

The first to third emissive regions PXA-R, PXA-G, and PXA-B may provide first color light, second color light, and third color light that have different colors from each other, respectively. For example, the first color light may be red light, the second color light may be green light, and the third color light may be blue light. However, examples of the first color light, the second color light, and the third color light are not necessarily limited thereto.

The first to third emissive regions PXA-R, PXA-G, and PXA-B may be defined as regions or planar areas where upper surfaces of anodes are exposed by light emitting openings that will be described below. The peripheral region NPXA may set the boundaries of the first to third emissive regions PXA-R, PXA-G, and PXA-B and may prevent color mixing between the first to third emissive regions PXA-R, PXA-G, and PXA-B.

A plurality of first emissive regions PXA-R, a plurality of second emissive regions PXA-G, and a plurality of third emissive regions PXA-B may be provided. The plurality of first emissive regions PXA-R, the plurality of second emissive regions PXA-G, and the plurality of third emissive regions PXA-B may have a predetermined arrangement in the display region DA and may be repeatedly disposed. For example, the first and third emissive regions PXA-R and PXA-B may be alternately arranged in the first direction DR1 to form a “first group” of emissive regions (e.g., a first row). The second emissive regions PXA-G may be arranged in the first direction DR1 to form a “second group” of emissive regions (e.g., a second row). The “first group” and the “second group” may be provided in plural numbers, and the “first groups” and the “second groups” may be alternately arranged in the second direction DR2.

One second emissive region PXA-G may be spaced apart from one first emissive region PXA-R or one third emissive region PXA-B, in a fourth direction DR4. The fourth direction DR4 may be defined as a direction between the first and second directions DR1 and DR2, such as an inclined direction relative to one or both of the first direction DR1 and the second direction DR2.

Meanwhile, FIG. 4 illustrates an arrangement form of the first to third emissive regions PXA-R, PXA-G, and PXA-B. However, without being limited thereto, the first to third emissive regions PXA-R, PXA-G, and PXA-B may be arranged in various patterns. In an embodiment, the first to third emissive regions PXA-R, PXA-G, and PXA-B may have a PENTILE™ arrangement form as illustrated in FIG. 4. Alternatively, the first to third emissive regions PXA-R, PXA-G, and PXA-B may have a stripe arrangement form or a Diamond Pixel™ arrangement form.

The first to third emissive regions PXA-R, PXA-G, and PXA-B may have various shapes on the plane (e.g., a planar shape in the plan view). For example, the first to third emissive regions PXA-R, PXA-G, and PXA-B may have a polygonal planar shape, a circular planar shape or an oval planar shape. FIG. 4 illustrates the first and third emissive regions PXA-R and PXA-B having a quadrangular shape (or, a rhombic shape) on the plane and the second emissive regions PXA-G having an octagonal shape on the plane.

The first to third emissive regions PXA-R, PXA-G, and PXA-B may have the same shape on the plane, or at least some of the first to third emissive regions PXA-R, PXA-G, and PXA-B may have different shapes. FIG. 4 illustrates the first and third emissive regions PXA-R and PXA-B having the same shape on the plane and the second emissive regions PXA-G having a shape different from those of the first and third emissive regions PXA-R and PXA-B.

At least some of the first to third emissive regions PXA-R, PXA-G, and PXA-B may have different areas on the plane (e.g., a planar area in the plan view). In an embodiment, the area (e.g., the planar area) of the first emissive region PXA-R emitting red light may be greater than the area of the second emissive region PXA-G emitting green light and may be smaller than the area of the third emissive region PXA-B emitting blue light. However, a relative size (e.g., planar area) relationship between the first to third emissive regions PXA-R, PXA-G, and PXA-B depending on emission colors is not limited thereto and may vary depending on the design of the display module DM (refer to FIG. 2). Furthermore, without being limited thereto, the first to third emissive regions PXA-R, PXA-G, and PXA-B may have the same area on the plane.

Meanwhile, the shapes, areas and arrangement of the first to third emissive regions PXA-R, PXA-G, and PXA-B of the display module DM (refer to FIG. 2) of the present disclosure may be diversely designed depending on the colors of emitted light or the size and configuration of the display module DM (refer to FIG. 2) and are not limited to the embodiment illustrated in FIG. 4.

According to an embodiment of the present disclosure, a plurality of upper patterns UPT may be provided. The upper patterns UPT may not overlap the first to third emissive regions PXA-R, PXA-G, and PXA-B. The upper patterns UPT may have a shape surrounding the first to third emissive regions PXA-R, PXA-G, and PXA-B. Specifically, on the plane, the upper patterns UPT may have a closed-line shape respectively surrounding the first to third emissive regions PXA-R, PXA-G, and PXA-B. The planar shape of the upper patterns UPT will be described below in detail.

Figure 5:
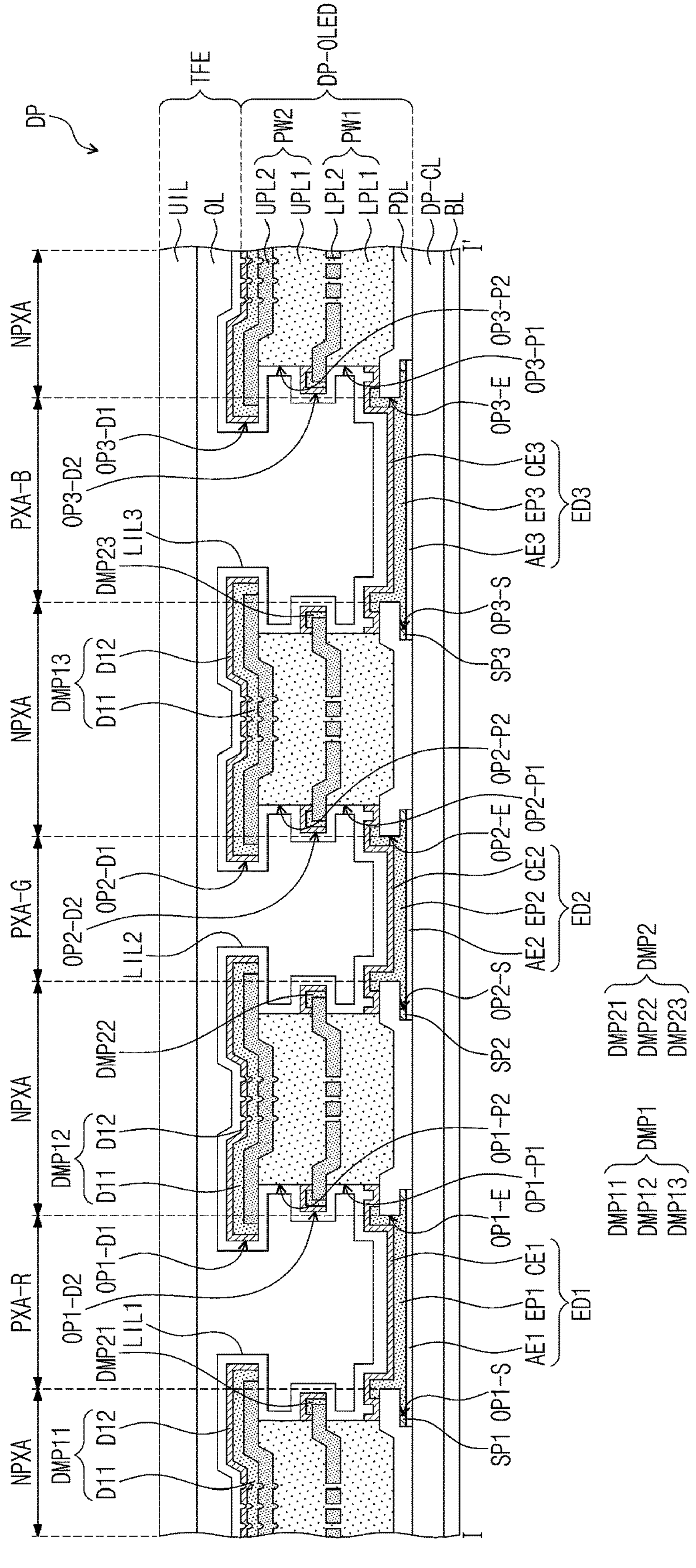
FIG. 5 is an enlarged cross-sectional view of the display panel taken along line I-I' of FIG. 4 according to an embodiment of the present disclosure.

FIG. 5 is a sectional view of the display panel DP taken along line I-I' of FIG. 4 according to an embodiment of the present disclosure.

FIG. 5 is an enlarged view illustrating one first emissive region PXA-R, one second emissive region PXA-G, and one third emissive region PXA-B.

Referring to FIG. 5, the display panel DP according to this embodiment may include the base layer BL, the circuit element layer DP-CL, the display element layer DP-OLED, and the encapsulation layer TFE. The display element layer DP-OLED may include a light emitting element ED provided in plural including a plurality of light emitting elements ED1, ED2, and ED3, a sacrificial pattern provided in plural including a plurality of sacrificial patterns SP1, SP2, and SP3, a pixel defining layer PDL, a first barrier wall PW1 of a first barrier pattern layer, a second barrier wall PW2 of a second barrier pattern layer, a first dummy pattern DMP1 of a first dummy pattern layer, and a second dummy pattern DMP2 of a second dummy pattern layer. The circuit element layer DP-CL is simply illustrated in FIG. 5, and details thereof will be described with reference to FIG. 6.

The light emitting elements ED1, ED2, and ED3 may include the first light emitting element ED1, the second light emitting element ED2, and the third light emitting element ED3.

The first light emitting element ED1 may include a first anode AE1, a first emission pattern EP1, and a first cathode CE1. The second light emitting element ED2 may include a second anode AE2, a second emission pattern EP2, and a second cathode CE2. The third light emitting element ED3 may include a third anode AE3, a third emission pattern EP3, and a third cathode CE3. The first to third anodes AE1, AE2, and AE3 may be provided as a layer including a plurality of patterns. In an embodiment, the first emission pattern EP1 may provide red light, the second emission pattern EP2 may provide green light, and the third emission pattern EP3 may provide blue light.

In this embodiment, first to third light emitting openings OP1-E, OP2-E, and OP3-E may be defined in the pixel defining layer PDL. That is, a solid portion or material of the pixel defining layer PDL may define a plurality of light emitting openings respectively corresponding to emissive regions. The solid portion and the openings may together define a layer, such as the pixel defining layer PDL described above.

The first light emitting opening OP1-E may expose at least a portion of the first anode AE1 (e.g., to outside the pixel defining layer PDL). The first emissive region PXA-R may be defined as a region of (e.g., corresponding to a planar area of) an upper surface of the first anode AE1 that is exposed to outside the pixel defining layer PDL) by the first light emitting opening OP1-E. The second light emitting opening OP2-E may expose at least a portion of the second anode AE2. The second emissive region PXA-G may be defined as a region of an upper surface of the second anode AE2 that is exposed by the second light emitting opening OP2-E. The third light emitting opening OP3-E may expose at least a portion of the third anode AE3. The third emissive region PXA-B may be defined as a region of an upper surface of the third anode AE3 that is exposed by the third light emitting opening OP3-E.

In this embodiment, the sacrificial patterns SP1, SP2, and SP3 may include the first sacrificial pattern SP1, the second sacrificial pattern SP2, and the third sacrificial pattern SP3 which are spaced apart from each other in a direction along the circuit element layer DP-CL. The first to third sacrificial patterns SP1, SP2, and SP3 may be disposed on the upper surfaces of the first to third anodes AE1, AE2, and AE3, respectively. First to third sacrificial openings OP1-S, OP2-S, and OP3-S corresponding to the first to third light emitting openings OP1-E, OP2-E, and OP3-E may be defined in (or by) the first to third sacrificial patterns SP1, SP2, and SP3, respectively.

In this embodiment, a first-first barrier wall opening OP1-P1, a first-second barrier wall opening OP2-P1, and a first-third barrier wall opening OP3-P1 corresponding to the first, second, and third light emitting openings OP1-E, OP2-E, and OP3-E may be defined in the layer of the first barrier wall PW1. The first barrier wall PW1 may include a first lower layer LPL1 and a second lower layer LPL2.

The first lower layer LPL1 may include (or define) first lower side surfaces S1-Pa (refer to FIG. 7A) that define first lower regions Ala (refer to FIG. 8H) of the first-first barrier wall opening OP1-P1, the first-second barrier wall opening OP2-P1, and the first-third barrier wall opening OP3-P1, and the second lower layer LPL2 may include second lower side surfaces S2-Pa (refer to FIG. 7A) that define second lower regions A2*a* (refer to FIG. 8H) of the first-first barrier wall opening OP1-P1, the first-second barrier wall opening OP2-P1, and the first-third barrier wall opening OP3-P1.

The first emission pattern EP1 and the first cathode CE1 may be disposed in the first light emitting opening OP1-E and the first-first barrier wall opening OP1-P1. The second emission pattern EP2 and the second cathode CE2 may be disposed in the second light emitting opening OP2-E and the first-second barrier wall opening OP2-P1. The third emission pattern EP3 and the third cathode CE3 may be disposed in the third light emitting opening OP3-E and the first-third barrier wall opening OP3-P1. The first to third cathodes CE1, CE2, and CE3 may make contact with the first lower side surfaces S1-Pa (refer to FIG. 7A) of the first lower layer LPL1. As being in contact, elements may form an interface therebetween.

In this embodiment, the first to third cathodes CE1, CE2, and CE3 may be physically separated from each other by the second lower layer LPL2 that forms first tip portions TP1 (refer to FIG. 6) and may be brought into contact with the first lower layer LPL1 in the first barrier wall openings OP1-P1, OP2-P1, and OP3-P1. Accordingly, the first to third cathodes CE1, CE2, and CE3 may be electrically connected together and may receive a common voltage. The first lower layer LPL1 may have a thickness which is greater than a thickness of the second lower layer LPL2 and thus may decrease contact resistance with the first to third cathodes CE1, CE2, and CE3. Accordingly, a common cathode voltage may be uniformly provided for the emissive regions PXA-R, PXA-G, and PXA-B.

According to a method of providing the display panel DP of the present disclosure, a plurality of first emission patterns EP1 may be patterned into discrete planar shapes or patterns and deposited in pixel units, by function of the first tip portions TP1 (refer to FIG. 6) defined in (or by) the first barrier wall PW1. That is, a material of the first emission patterns EP1 may be commonly formed or provided on a base structure by using an open mask, but may be easily divided in pixel units by the physical structure of the first barrier wall PW1 which is located at the various emissive regions.

In contrast, in a case in which the first emission patterns EP1 are patterned by using a fine metal mask (FMM), a spacer that protrudes from a conventional barrier wall has to be provided to support the fine metal mask. Furthermore, since the fine metal mask is spaced apart from the underlying base structure, by the height of the conventional barrier wall and the spacer, such as apart from a base surface on which patterning is performed, there may be a limitation in the implementation of high resolution of the patterns being formed and the image IM displayed therewith. In addition, since the fine metal mask is brought into contact with the spacer, foreign matter may remain on the spacer after the patterning process of a material layer of the first emission patterns EP1, or the spacer may be damaged by a dent defect of the fine metal mask. Therefore, a defective display panel may be formed.

According to an embodiment of the present disclosure, the physical separation between the light emitting elements ED1, ED2, and ED3 may be easily achieved since the first barrier wall PW1 is included to effectively divide a material layer commonly formed on the underlying stacked structure. Accordingly, current leakage (e.g., electrical current) or a driving error between the adjacent emissive regions PXA-R, PXA-G, and PXA-B may be prevented, and the light emitting elements ED1, ED2, and ED3 may be independently driven.

In particular, by patterning the plurality of first emission patterns EP1 without a mask in contact with an internal component in the display region DA (refer to FIG. 2), a defect rate may be reduced. Thus, the display panel DP having improved process reliability may be provided. Since patterning of a commonly disposed material layer is possible even though a separate spacer for support that protrudes from the second barrier wall PW2 is not provided, the planar areas of the emissive regions PXA-R, PXA-G, and PXA-B may be scaled down and minimized, and thus, the display panel DP capable of easily implementing high resolution with an increased number of various emissive regions may be provided.

Furthermore, in the manufacture or providing of the large-area display panel DP, a large-area mask may be omitted. Accordingly, process costs may be reduced, and the display panel DP may not be affected by defects that are likely to occur in the large-area mask. Thus, the display panel DP having improved process reliability may be provided.

In this embodiment, a second-first barrier wall opening OP1-P2, a second-second barrier wall opening OP2-P2, and a second-third barrier wall opening OP3-P2 that correspond to the first, second, and third light emitting openings OP1-E, OP2-E, and OP3-E and the first-first barrier wall opening OP1-P1, the first-second barrier wall opening OP2-P1, and the first-third barrier wall opening OP3-P1 may be defined in a layer of the second barrier wall PW2. Each of the second-first barrier wall opening OP1-P2, the second-second barrier wall opening OP2-P2, and the second-third barrier wall opening OP3-P2 may include a first upper region Alb (refer to FIG. 8H) and a second upper region A2*b* (refer to FIG. 8H).

The second barrier wall PW2 may include a first upper layer UPL1 and a second upper layer UPL2. The first upper layer UPL1 may include first upper side surfaces S1-Pb (refer to FIG. 7A) that define each of the first upper regions Alb (refer to FIG. 8H) of the second-first barrier wall opening OP1-P2, the second-second barrier wall opening OP2-P2, and the second-third barrier wall opening OP3-P2, and the second upper layer UPL2 may include second upper side surfaces S2-Pb (refer to FIG. 7A) that define each of the second upper regions A2*b* (refer to FIG. 8H) of the second-first barrier wall opening OP1-P2, the second-second barrier wall opening OP2-P2, and the second-third barrier wall opening OP3-P2.

The first dummy pattern DMP1 may include a first-first dummy pattern DMP11, a first-second dummy pattern DMP12, and a first-third dummy pattern DMP13. The first-first dummy pattern DMP11, the first-second dummy pattern DMP12, and the first-third dummy pattern DMP13 may be disposed on the second barrier wall PW2. The first-first dummy pattern DMP11, the first-second dummy pattern DMP12, and the first-third dummy pattern DMP13 may surround the first to third emissive regions PXA-R, PXA-G, and PXA-B on the plane, respectively. Each of the first-first dummy pattern DMP11, the first-second dummy pattern DMP12, and the first-third dummy pattern DMP13 may include a first-first dummy layer D11 and a first-second dummy layer D12.

A first-first dummy opening OP1-D1, a first-second dummy opening OP2-D1, and a first-third dummy opening OP3-D1 corresponding to the first, second, and third light emitting openings OP1-E, OP2-E, and OP3-E may be defined in the first-first dummy pattern DMP11, the first-second dummy pattern DMP12, and the first-third dummy pattern DMP13. The first-first dummy opening OP1-D1 may be defined by inner surfaces of the first-first dummy layer D11 and the first-second dummy layer D12 of the first-first dummy pattern DMP11, where the inner surfaces are closest to a center of the respective emissive opening, for example. The first-second dummy opening OP2-D1 may be defined by inner surfaces of the first-first dummy layer D11 and the first-second dummy layer D12 of the first-second dummy pattern DMP12. The first-third dummy opening OP3-D1 may be defined by inner surfaces of the first-first dummy layer D11 and the first-second dummy layer D12 of the first-third dummy pattern DMP13.

The second dummy pattern DMP2 may include a second-first dummy pattern DMP21, a second-second dummy pattern DMP22, and a second-third dummy pattern DMP23. The second-first dummy pattern DMP21, the second-second dummy pattern DMP22, and the second-third dummy pattern DMP23 may surround the first to third emissive regions PXA-R, PXA-G, and PXA-B on the plane, respectively. Each of the second-first dummy pattern DMP21, the second-second dummy pattern DMP22, and the second-third dummy pattern DMP23 may include a second-first dummy layer D21 (refer to FIG. 6) and a second-second dummy layer D22 (refer to FIG. 6).

A second-first dummy opening OP1-D2, a second-second dummy opening OP2-D2, and a second-third dummy opening OP3-D2 corresponding to the first, second, and third light emitting openings OP1-E, OP2-E, and OP3-E may be defined in the second-first dummy pattern DMP21, the second-second dummy pattern DMP22, and the second-third dummy pattern DMP23. The second-first dummy opening OP1-D2 may be defined by an inner surface of the second-first dummy pattern DMP21. The second-second dummy opening OP2-D2 may be defined by an inner surface of the second-second dummy pattern DMP22. The second-third dummy opening OP3-D2 may be defined by an inner surface of the second-third dummy pattern DMP23.

The encapsulation layer TFE may include lower inorganic encapsulation patterns LIL1, LIL2, and LIL3 of a lower inorganic layer, an organic encapsulation film OL, and an upper inorganic encapsulation film UIL as an upper inorganic layer.

In this embodiment, the lower inorganic encapsulation patterns LIL1, LIL2, and LIL3 may include the first lower inorganic encapsulation pattern LIL1, the second lower inorganic encapsulation pattern LIL2, and the third lower inorganic encapsulation pattern LIL3. The first to third lower inorganic encapsulation patterns LIL1, LIL2, and LIL3 may be provided in pattern forms spaced apart from each other. One or more patterns of the lower inorganic layer may be provided as a single layer common to more than one emissive area, without being limited thereto.

The first to third lower inorganic encapsulation patterns LIL1, LIL2, and LIL3 may cover the first to third light emitting elements ED1, ED2, and ED3, respectively. Specifically, the first to third lower inorganic encapsulation patterns LIL1, LIL2, and LIL3 may be disposed on the first to third cathodes CE1, CE2, and CE3 and may cover the first to third cathodes CE1, CE2, and CE3.

The first lower inorganic encapsulation pattern LIL1 may make contact with an inner surface of the second barrier wall PW2 that defines the second-first barrier wall opening OP1-P2. The second lower inorganic encapsulation pattern LIL2 may make contact with an inner surface of the second barrier wall PW2 that defines the second-second barrier wall opening OP2-P2. The third lower inorganic encapsulation pattern LIL3 may make contact with an inner surface of the second barrier wall PW2 that defines the second-third barrier wall opening OP3-P2.

According to an embodiment of the present disclosure, due to the depressed first upper layer UPL1 which is recessed further than the second upper layer UPL2, each of the first to third lower inorganic encapsulation patterns LIL1, LIL2, and LIL3 may extend along and cover a lower surface of the second upper layer UPL2 exposed from the first upper layer UPL1 and a lower surface of the second lower layer LPL2. Accordingly, a moisture permeation path to the first to third light emitting elements ED1, ED2, and ED3 may be lengthened. Thus, infiltration of moisture into the light emitting elements ED1, ED2, and ED3 may be prevented, and the light emitting elements ED1, ED2, and ED3 with improved process reliability and reduced defects may be provided.

Figure 6:
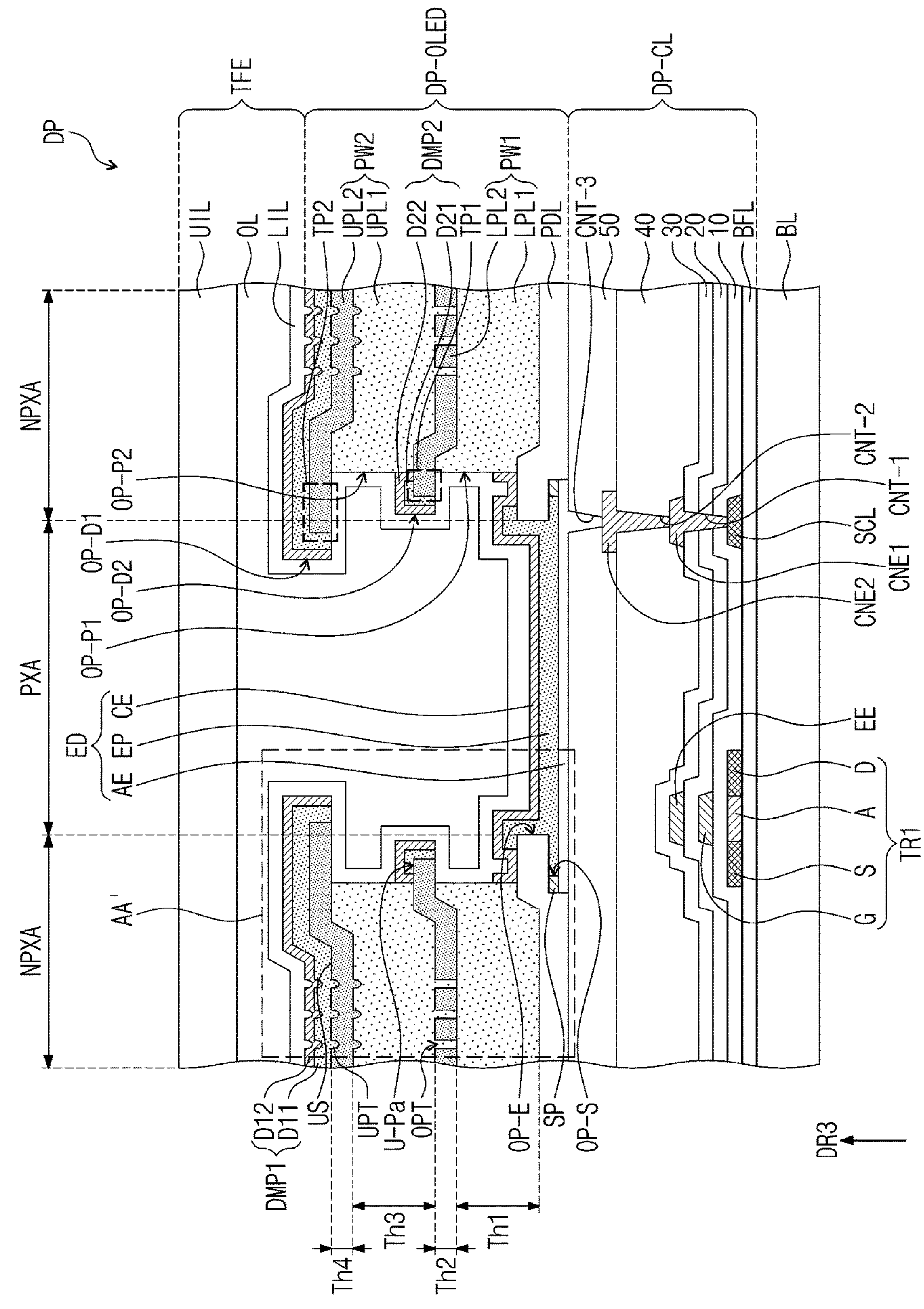
FIG. 6 is an enlarged cross-sectional view of a partial region of the display panel according to an embodiment of the present disclosure.

FIG. 6 is an enlarged sectional view of a partial region of the display panel DP according to an embodiment of the present disclosure. FIG. 6 is an enlarged view of the emissive region PXA in the display region DA (refer to FIG. 3), and the emissive region PXA of FIG. 6 may correspond to one of the first to third emissive regions PXA-R, PXA-G, and PXA-G of FIG. 4. Referring to FIG. 6, the display panel DP may include the base layer BL, the circuit element layer DP-CL, the display element layer DP-OLED, and the encapsulation layer TFE.

The display panel DP may include a plurality of insulating layers, a semiconductor pattern, a conductive pattern, and a signal line. An insulating layer, a semiconductor layer, and a conductive layer are formed by coating, deposition, or the like. Thereafter, the insulating layer, the semiconductor layer, and the conductive layer may be selectively subjected to patterning by photolithography and etching. The semiconductor pattern, the conductive pattern, and the signal line included in the circuit element layer DP-CL and the display element layer DP-OLED may be formed by the above-described method.

The circuit element layer DP-CL may be disposed on the base layer BL. The circuit element layer DP-CL may include a buffer layer BFL, a transistor TR1, a signal transmission region SCL, first to fifth insulating layers 10, 20, 30, 40, and 50, an electrode EE, and a plurality of connecting electrodes CNE1 and CNE2.

The buffer layer BFL may be disposed on the base layer BL. The buffer layer BFL may improve a coupling force between the base layer BL and a semiconductor pattern. The buffer layer BFL may include silicon oxide layers and silicon nitride layers. The silicon oxide layers and the silicon nitride layers may be alternately stacked one above another.

The semiconductor pattern of a semiconductor layer may be disposed on the buffer layer BFL. The semiconductor pattern may include poly-silicon. However, without being limited thereto, the semiconductor pattern may include amorphous silicon or metal oxide. FIG. 6 illustrates only a part of a plurality of semiconductor patterns of the semiconductor layer, and other semiconductor patterns may be additionally disposed in the plurality of emissive regions PXA-R, PXA-G, and PXA-B (refer to FIG. 4).

The semiconductor patterns may be arranged across the plurality of emissive regions PXA-R, PXA-G, and PXA-B (refer to FIG. 4) according to a specific rule. The semiconductor pattern may have different electrical properties depending on whether a region of the semiconductor pattern is doped or not. The semiconductor pattern may include a first region having a high doping concentration and a second region having a low doping concentration which is lower than the high doping concentration. The first region may be doped with an N-type dopant or a P-type dopant. A P-type transistor may include a first region doped with a P-type dopant.

The first region may have a higher conductivity than the second region and may substantially serve as an electrode or a signal line. The second region may substantially correspond to an active (or, channel) region of the transistor TR1. In other words, one portion of the semiconductor pattern may be the active region of the transistor TR1, another portion may be a source or drain of the transistor TR1, and another portion may be a conductive region.

A source S, an active region A, and a drain D of the transistor TR1 may be formed from a same one of the semiconductor pattern. FIG. 6 illustrates a portion of the signal transmission region SCL formed from the semiconductor pattern. Although not separately illustrated, the signal transmission region SCL may be connected to the drain D of the transistor TR1 on the plane.

The first to fifth insulating layers 10, 20, 30, 40, and 50 may be disposed on the buffer layer BFL, in order in a direction from the base layer BL. The first to fifth insulating layers 10 to 50 may be inorganic layers or organic layers.

The first insulating layer 10 may be disposed on the buffer layer BFL. A gate G may be disposed on the first insulating layer 10. The second insulating layer 20 may be disposed on the first insulating layer 10 and may cover the gate G. The electrode EE may be disposed on the second insulating layer 20. The third insulating layer 30 may be disposed on the second insulating layer 20 and may cover the electrode EE.

The first connecting electrode CNE1 may be disposed on the third insulating layer 30. The first connecting electrode CNE1 may be connected to the signal transmission region SCL through a contact hole CNT-1 penetrating the first to third insulating layers 10, 20, and 30. The fourth insulating layer 40 may be disposed on the third insulating layer 30 and may cover the first connecting electrode CNE1. The fourth insulating layer 40 may be an organic layer.

The second connecting electrode CNE2 may be disposed on the fourth insulating layer 40. The second connecting electrode CNE2 may be connected to the first connecting electrode CNE1 through a contact hole CNT-2 penetrating the fourth insulating layer 40. The fifth insulating layer 50 may be disposed on the fourth insulating layer 40 and may cover the second connecting electrode CNE2. The fifth insulating layer 50 may be an organic layer.

The display element layer DP-OLED may be disposed on the circuit element layer DP-CL. The display element layer DP-OLED may include a light emitting element ED, the pixel defining layer PDL, the first barrier wall PW1, the second barrier wall PW2, the first dummy pattern DMP1, and the second dummy pattern DMP2.

The light emitting element ED may include an anode AE (or, a first electrode), an emission pattern EP of a light emitting layer, and a cathode CE (or, a second electrode). The above-described first to third light emitting elements ED1, ED2 and ED3 may include substantially the same configuration as the light emitting element ED of FIG. 6. Descriptions of the anode AE, the emission pattern EP, and the cathode CE may be identically applied to the anode, the emission pattern, and the cathode of each of the first to third light emitting elements.

The anode AE may be disposed on the fifth insulating layer 50 of the circuit element layer DP-CL. The anode AE may be a transmissive electrode, a transflective electrode, or a reflective electrode. The anode AE may have conductivity. For example, as long as the anode AE is capable of having conductivity, the anode AE may be formed of various materials such as metal, transparent conductive oxide (TCO), or a conductive polymer material.

The anode AE may be connected to the second connecting electrode CNE2 by a connection contact hole CNT-3 defined to penetrate the fifth insulating layer 50. Accordingly, the anode AE may be electrically connected to the signal transmission region SCL through the first and second connecting electrodes CNE1 and CNE2 and may be electrically connected to a corresponding circuit element.

According to an embodiment of the present disclosure, the display panel DP may further include a sacrificial pattern SP. The sacrificial pattern SP may be disposed on an upper surface of the anode AE. A sacrificial opening OP-S that exposes a portion of the upper surface of the anode AE to outside the sacrificial layer may be defined in the sacrificial pattern SP. The sacrificial pattern SP may include amorphous transparent conductive oxide.

The pixel defining layer PDL may be disposed on the fifth insulating layer 50 of the circuit element layer DP-CL. The pixel defining layer PDL may have a light emitting opening OP-E defined therein. The light emitting opening OP-E may overlap the anode AE, and the pixel defining layer PDL may expose at least a portion of the anode AE through the light emitting opening OP-E.

In addition, the light emitting opening OP-E may correspond to or be aligned with the sacrificial opening OP-S of the sacrificial pattern SP. According to an embodiment of the present disclosure, the upper surface of the anode AE may be spaced apart from the pixel defining layer PDL on the section with the sacrificial pattern SP therebetween. Accordingly, damage to the anode AE in a process of forming the light emitting opening OP-E may be prevented.

On the plane, the area (e.g., the planar area) of the light emitting opening OP-E may be smaller than the area of the sacrificial opening OP-S. That is, an inner surface of the pixel defining layer PDL that defines the light emitting opening OP-E may be closer to the center of the anode AE than an inner surface of the sacrificial pattern SP that defines the sacrificial opening OP-S. However, without being limited thereto, the inner surface of the sacrificial pattern SP that defines the sacrificial opening OP-S may be substantially aligned with (e.g., coplanar with) the inner surface of the pixel defining layer PDL that defines the corresponding light emitting opening OP-E. In this case, the emissive region PXA may be a region of the anode AE exposed from the corresponding sacrificial opening OP-S. Meanwhile, in an embodiment of the present disclosure, the sacrificial patterns SP may be omitted.

The pixel defining layer PDL may include an inorganic insulating material. For example, the pixel defining layer PDL may include silicon nitride $SiN_x$. The pixel defining layer PDL may be disposed between the anode AE and the first barrier wall PW1 and may block electrical connection between the anode AE and the first barrier wall PW1.

The first barrier wall PW1 may be disposed on the pixel defining layer PDL. A first barrier wall opening OP-P1 (or, a lower barrier wall opening) may be defined in the first barrier wall PW1. The first barrier wall opening OP-P1 may correspond to the light emitting opening OP-E and may expose at least a portion of the anode AE.

The first barrier wall PW1 may have an undercut shape in cross-section as illustrated in FIG. 6. The first barrier wall PW1 may include multiple layers sequentially stacked on another, and at least one layer among the multiple layers may be depressed or recessed, when compared to layers stacked adjacent thereto which protrude relative to the inner sidewall of the one layer. Accordingly, the first barrier wall PW1 may include (or define) the first tip portion TP1. In FIG. 6, for example, the second lower layer LPL2 protrudes further than an inner sidewall of the first lower layer LPL1 and defines the first tip portion TP1.

The first barrier wall PW1 may include the first lower layer LPL1 and the second lower layer LPL2. The first lower layer LPL1 may be disposed on the pixel defining layer PDL, and the second lower layer LPL2 may be disposed on the first lower layer LPL1. The first lower layer LPL1 may be thicker than the second lower layer LPL2, along a thickness direction. According to an embodiment of the present disclosure, the first lower layer LPL1 may be relatively depressed with respect to the emissive region PXA when compared to the second lower layer LPL2. That is, the first lower layer LPL1 may be undercut with respect to the second lower layer LPL2. The first tip portion TP1 may be defined by a portion of the second lower layer LPL2 that protrudes further from the first lower layer LPL1 in a direction toward the emissive region PXA.

The first lower layer LPL1 may include a conductive material. For example, the first lower layer LPL1 may include a metallic material, an alloy material, or metal nitride. According to an embodiment of the present disclosure, the first lower layer LPL1 may include molybdenum (Mo). Molybdenum (Mo) may have high conductivity, and an oxide film may not be formed on a surface thereof. Accordingly, as the first lower layer LPL1 includes molybdenum (Mo), the cathode CE to be described below may be easily electrically connected with the first lower layer LPL1, and thus a common cathode voltage may be uniformly provided for the emissive regions PXA-R, PXA-G, and PXA-G (refer to FIG. 4). Accordingly, the display panel DP having reliability may be provided. According to an embodiment of the present disclosure, the first lower layer LPL1 may have a first thickness Th1 of about 2500 kiloangstroms (KÅ) to about 3000 KÅ.

The second lower layer LPL2 may include an inorganic material. For example, the second lower layer LPL2 may include at least one of silicon nitride ($SiN_x$), silicon oxide ($SiO_2$), silicon oxy-nitride (SiON) and aluminum oxide ($AL_2O_3$). According to an embodiment of the present disclosure, the second lower layer LPL2 may include silicon nitride ($SiN_x$). In this case, the second lower layer LPL2 may have a higher elastic modulus value than when the second lower layer LPL2 includes titanium (Ti). Accordingly, bending of the first tip portion TP1 defined in the second lower layer LPL2 may be reduced or prevented. However, the material of the second lower layer LPL2 is not limited thereto.

According to an embodiment of the present disclosure, as the second lower layer LPL2 includes an inorganic material, an interfacial adhesive force between the second lower layer LPL2 and a lower inorganic encapsulation pattern LIL may be increased, and infiltration of moisture into the light emitting element ED may be prevented. Detailed description thereabout will be given below together with description of the lower inorganic encapsulation pattern LIL. The second thickness Th2 of the second lower layer LPL2 may be smaller than the first thickness Th1 of the first lower layer LPL1. For example, the second thickness Th2 of the second lower layer LPL2 may range from about 1000 KÅ to about 2000 KÅ.

According to an embodiment of the present disclosure, a plurality of opening patterns OPT may be defined in the second lower layer LPL2. Here, a solid portion of the second lower layer LPL2 may define a plurality of openings therein. The plurality of opening patterns OPT may correspond to through-holes penetrating a thickness of the second lower layer LPL2. The first lower layer LPL1 may be electrically connected with the first upper layer UPL1, which will be described below, at or through the plurality of opening patterns OPT. Although six opening patterns OPT relative to a single emissive region PXA are illustrated in FIG. 6, six or more opening patterns OPT may be formed.

The emission pattern EP may be disposed on the anode AE. At least a portion of the emission pattern EP may be disposed in the light emitting opening OP-E and the first barrier wall opening OP-P1. Furthermore, in the embodiment in which the display panel DP includes the sacrificial patterns SP, the emission pattern EP may also be disposed in the sacrificial opening OP-S. The emission pattern EP may extend out of the collective opening (OP-S together with OP-E and OP-P1) to cover a portion of an upper surface of the pixel defining layer PDL exposed from the first barrier wall opening OP-P1.

The emission pattern EP may include an emissive layer including a luminescent material. The emission pattern EP may further include a hole injection layer (HIL) and a hole transport layer (HTL) that are disposed between the anode AE and the emissive layer and may further include an electron transport layer (ETL) and an electron injection layer (EIL) that are disposed on the emissive layer. The emission pattern EP may be referred to as an "organic layer" or an "intermediate layer".

The cathode CE may be disposed on the emission pattern EP. In a method of providing the structure shown in FIG. 6, a material layer of the cathode CE may be subjected to patterning by the first tip portion TP1 defined in the first barrier wall PW1, where application of the material layer on the structure is essentially disconnected by the first tip portion TP1. At least a portion of the cathode CE may be disposed in the first barrier wall opening OP-P1. In an embodiment of the present disclosure, a portion of the cathode CE may also be disposed in the light emitting opening OP-E depending on the thickness of the emission pattern EP or the thickness of the pixel defining layer PDL.

The cathode CE may make contact with the first lower layer LPL1. The cathode CE may have conductivity. For example, as long as the cathode CE is capable of having conductivity, the cathode CE may be formed of various materials such as metal, transparent conductive oxide (TCO), or a conductive polymer material. According to an embodiment of the present disclosure, the first barrier wall PW1 may receive a bias voltage. The cathode CE may receive the bias voltage through electrical connection to the first barrier wall PW1.

Although not illustrated, the display panel DP may further include a capping pattern. The capping pattern may be disposed on the cathode CE, and at least a portion of the capping pattern may be disposed in the first barrier wall opening OP-P1. The capping pattern may be subjected to patterning by the first tip portion TP1 formed in the first barrier wall PW1.

The second barrier wall PW2 may be disposed on the first barrier wall PW1. A second barrier wall opening OP-P2 (or, an upper barrier wall opening) may be defined in the second barrier wall PW2. The second barrier wall opening OP-P2 may correspond to the light emitting opening OP-E and the first barrier wall opening OP-P1 and may expose at least a portion of the anode AE.

The second barrier wall PW2 may have an undercut shape on the section (e.g., in the cross-section). The second barrier wall PW2 may include multiple layers sequentially stacked one above another, and at least one layer among the multiple layers may be depressed when compared to layers stacked adjacent thereto. Accordingly, the second barrier wall PW2 may include a second tip portion TP2.

The second barrier wall PW2 may include the first upper layer UPL1 and the second upper layer UPL2. The first upper layer UPL1 may be disposed on the first barrier wall PW1, and the second upper layer UPL2 may be disposed on the first upper layer UPL1. The first upper layer UPL1 may be thicker than the second upper layer UPL2.

According to an embodiment of the present disclosure, the first upper layer UPL1 may be relatively depressed with respect to the emissive region PXA when compared to the second upper layer UPL2. That is, the first upper layer UPL1 may be undercut with respect to the second upper layer UPL2. The second tip portion TP2 may be defined by a portion of the second upper layer UPL2 that protrudes from the first upper layer UPL1 toward the emissive region PXA.

The first upper layer UPL1 may include a conductive material. For example, the first upper layer UPL1 may include a metallic material, an alloy material, or metal nitride. According to an embodiment of the present disclosure, the first upper layer UPL1 may include the same material as the first lower layer LPL1. Specifically, the first upper layer UPL1 and the first lower layer LPL1 may include molybdenum (Mo).

The first upper layer UPL1 may be electrically connected with the first lower layer LPL1 through the plurality of opening patterns OPT. The third thickness Th3 of the first upper layer UPL1 may be equal to the first thickness Th1 of the first lower layer LPL1. Specifically, the third thickness Th3 of the first upper layer UPL1 may range from about 2500 KÅ to about 3000 KÅ. The first upper layer UPL1 electrically connected with the first lower layer LPL1 at the plurality of opening patterns OPT may together define a same material layer of a barrier wall layer, where the barrier wall layer has two undercuts (or two protruding ends at the first tip portion TP1 and the second tip portion TP2).

The second upper layer UPL2 may include an inorganic material. For example, the second upper layer UPL2 may include at least one of silicon nitride ($SiN_x$), silicon oxide ($SiO_2$), silicon oxy-nitride (SiON) and aluminum oxide ($AL_2O_3$). According to an embodiment of the present disclosure, the second upper layer UPL2 may include a material different from that of the second lower layer LPL2. Specifically, the second upper layer UPL2 may include silicon oxide ($SiO_2$). In this case, the second upper layer UPL2 may have a higher elastic modulus value than when the second upper layer UPL2 includes titanium (Ti). Accordingly, bending of the second tip portion TP2 defined in the second upper layer UPL2 may be reduced or prevented.

However, the material of the second upper layer UPL2 is not limited thereto. According to an embodiment of the present disclosure, as the second upper layer UPL2 includes an inorganic material, an interfacial adhesive force between the second upper layer UPL2 and the lower inorganic encapsulation pattern LIL may be increased, and infiltration of moisture into the light emitting element ED may be prevented. The fourth thickness Th4 of the second upper layer UPL2 may be smaller than the third thickness Th3 of the first upper layer UPL1. For example, the fourth thickness Th4 of the second upper layer UPL2 may range from about 1000 KÅ to about 2000 KÅ.

According to an embodiment of the present disclosure, the second upper layer UPL2 may include or define the upper pattern UPT on (or at) an upper surface US thereof, where the upper surface is furthest from the base layer BL. The recesses or grooves of the upper pattern UPT may respectively correspond to the plurality of opening patterns OPT formed in the second lower layer LPL2. That is, in a method or providing the structure in FIG. 6, the upper pattern UPT may have a shape depressed or recessed in the direction opposite to the third direction DR3, by a material of the first upper layer UPL1 extending into the plurality of opening patterns OPT and forming the recesses or grooves. A path along which moisture infiltrates into the light emitting element ED may be lengthened along the upper surface US (including along inner surfaces at the recesses or grooves) by the upper pattern UPT, and thus infiltration of moisture into the light emitting element ED may be prevented. Detailed description thereabout will be given below. That is, a total path may be defined along a flat portion of the upper surface US together with up and down along the inner surfaces of the upper pattern UPT.

The first dummy pattern DMP1 may be disposed on the second barrier wall PW2. The first dummy pattern DMP1 may include a first-first dummy layer D11 and a first-second dummy layer D12. The first-first dummy layer D11 and the first-second dummy layer D12 may be sequentially stacked on the upper surface of the second upper layer UPL2 of the second barrier wall PW2 in the third direction DR3. The first-first dummy layer D11 may be formed to cover the second upper side surface S2-Pb (refer to FIG. 7A) of the second upper layer UPL2. Accordingly, the second upper side surface S2-Pb may not be exposed by the first-first dummy layer D11 to outside thereof. The first-second dummy layer D12 may be disposed on the first-first dummy layer D11 and may be formed to cover the first-first dummy layer D11. However, without being limited thereto, a portion of the second upper side surface S2-Pb may be exposed from the first-first dummy layer D11, and a portion of the first-first dummy layer D11 may also be exposed from the first-second dummy layer D12 to outside thereof.

The second dummy pattern DMP2 may be disposed on an upper surface U-Pa of the second lower layer LPL2 exposed from the first upper layer UPL1. The second dummy pattern DMP2 may include a second-first dummy layer D21 and a second-second dummy layer D22. The second-first dummy layer D21 and the second-second dummy layer D22 may be sequentially stacked on the upper surface U-Pa of the second lower layer LPL2 of the second barrier wall PW2 in the third direction DR3. The second-first dummy layer D21 may be formed to cover the second lower side surface S2-Pa (refer to FIG. 7A) of the second lower layer LPL2. Accordingly, the second lower side surface S2-Pa may not be exposed by the second-first dummy layer D21. The second-second dummy layer D22 may be disposed on the second-first dummy layer D21 and may be formed to cover the second-first dummy layer D21. However, without being limited thereto, a portion of the second lower side surface S2-Pa may be exposed from the second-first dummy layer D21, and a portion of the second-first dummy layer D21 may also be exposed from the second-second dummy layer D22.

The first-first dummy layer D11 and the second-first dummy layer D21 may include an organic material. For example, the first-first dummy layer D11 and the second-first dummy layer D21 may include the same material as the emission pattern EP. The first-first dummy layer D11 and the second-first dummy layer D21 may be simultaneously formed together with the emission pattern EP through one process and may be separated from the emission pattern EP by the undercut shapes of the first and second barrier walls PW1 and PW2. That is, the first-first dummy layer D11, the second-first dummy layer D21 and the emission pattern EP may be in a same layer as each other. As being in a same layer, patterns may be formed in a same process and/or include a same material as each other, patterns may be respective portions of a same material layer, patterns may be on a same layer by forming an interface with a same underlying or overlying layer, etc., without being limited thereto.

The first-second dummy layer D12 and the second-second dummy layer D22 may include a conductive material. For example, the first-second dummy layer D12 and the second-second dummy layer D22 may include the same material as the cathode CE. The first-second dummy layer D12 and the second-second dummy layer D22 may be simultaneously formed together with the cathode CE through one process and may be separated from the cathode CE by the undercut shapes of the first and second barrier walls PW1 and PW2.

A first dummy opening OP-D1 may be defined in the first dummy pattern DMP1. The first dummy opening OP-D1 may correspond to the light emitting opening OP-E. The first dummy opening OP-D1 may be defined by inner surfaces of the first-first dummy layer D11 and the first-second dummy layer D12. On the plane, the first dummy pattern DMP1 may have a closed-line shape surrounding the emissive region PXA.

A second dummy opening OP-D2 may be defined in the second dummy pattern DMP2. The second dummy opening OP-D2 may correspond to the light emitting opening OP-E. The second dummy opening OP-D2 may be defined by inner surfaces of the second-first dummy layer D21 and the second-second dummy layer D22. On the plane, the second dummy pattern DMP2 may have a closed-line shape surrounding the emissive region PXA. That is, an emissive opening may be defined by a collection of inner surfaces of a plurality of layers, such as inner sidewalls respectively defining the various openings OP-D1, OP-P2, OP-D2, OP-P1 and OP-E.

The encapsulation layer TFE may be disposed on the display element layer DP-OLED. The encapsulation layer TFE may include the lower inorganic encapsulation pattern LIL (or, the inorganic pattern), the organic encapsulation film OL, and the upper inorganic encapsulation film UIL.

The lower inorganic encapsulation pattern LIL may cover the light emitting element ED. Specifically, the lower inorganic encapsulation pattern LIL may be disposed on the cathode CE and may cover the cathode CE. Although not illustrated, the lower inorganic encapsulation pattern LIL may cover the capping pattern disposed on the cathode CE.

A portion of the lower inorganic encapsulation pattern LIL may be disposed in the light emitting opening OP-E, the first barrier wall opening OP-P1, and the second barrier wall opening OP-P2. Meanwhile, in an embodiment of the present disclosure, the lower inorganic encapsulation pattern LIL may not be disposed in the light emitting opening OP-E depending on the thicknesses of the emission pattern EP, the cathode CE, and the pixel defining layer PDL.

The organic encapsulation film OL may cover the lower inorganic encapsulation pattern LIL and may provide a flat upper surface. The upper inorganic encapsulation film UIL may be disposed on the organic encapsulation film OL.

The lower inorganic encapsulation pattern LIL and the upper inorganic encapsulation film UIL may protect the display element layer DP-OLED from moisture/oxygen, and the organic encapsulation film OL may protect the display element layer DP-OLED from foreign matter such as dust particles.

Figure 7A:
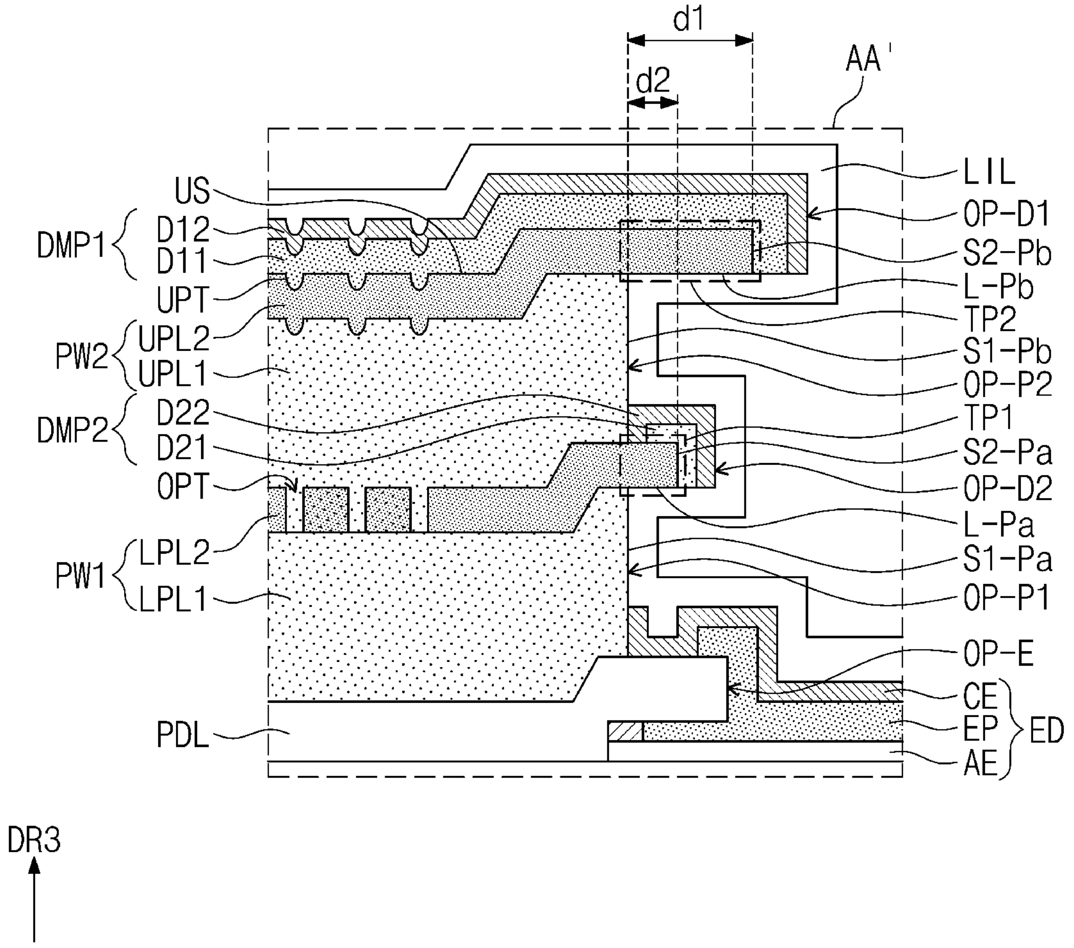
FIG. 7A is an enlarged cross-sectional view of region AA' in FIG. 6 according to an embodiment of the present disclosure.
Figure 7B:
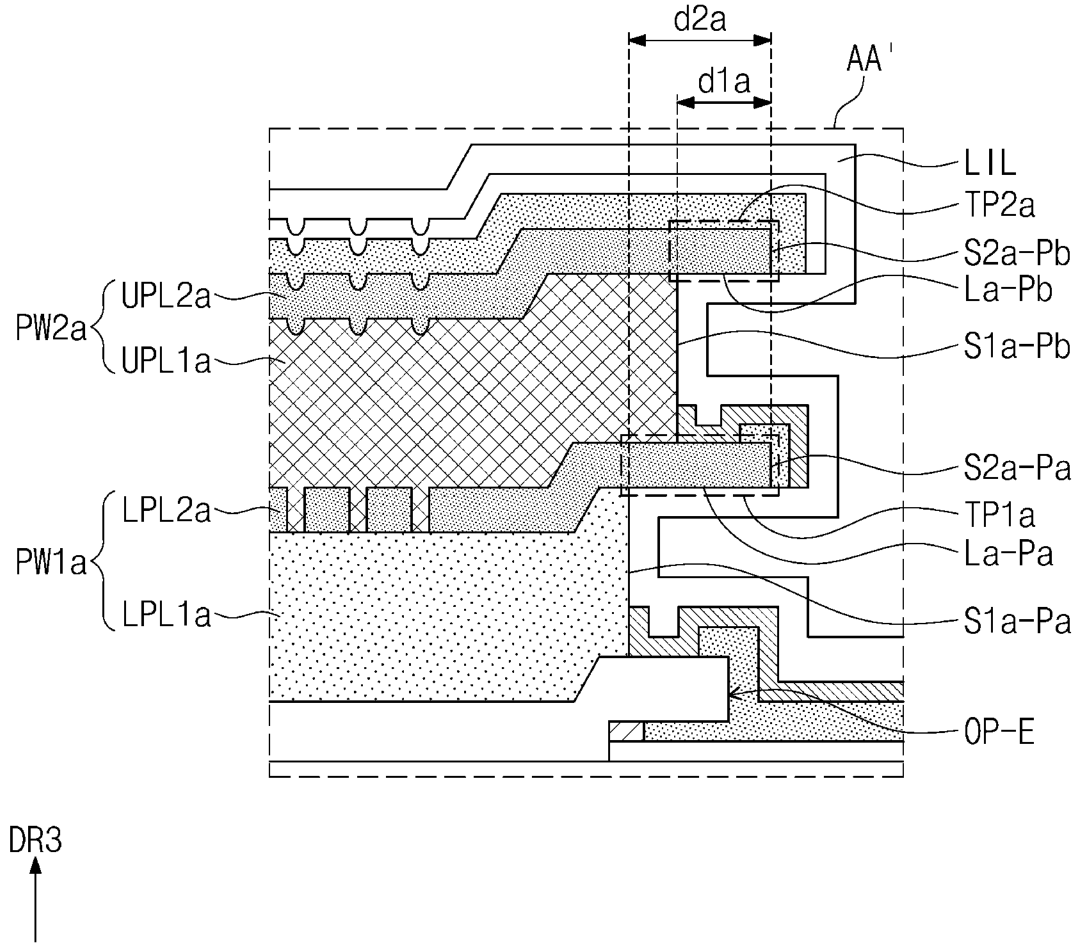
FIG. 7B is an enlarged cross-sectional view of region AA' in FIG. 6 according to an embodiment of the present disclosure.

FIGS. 7A and 7B are enlarged sectional (e.g., cross-sectional) views of region AA' in FIG. 6 according to an embodiment of the present disclosure.

Referring to FIG. 7A, the first barrier wall opening OP-P1 defined in the first barrier wall PW1 may include the first lower region Ala as a first volume of an emissive opening (refer to FIG. 8H) and the second lower region A2*a* as a second volume of the emission opening (refer to FIG. 8H) sequentially arranged in the third direction DR3. The first lower region Ala and the second lower region A2*a* may correspond to the emissive region PXA (refer to FIG. 6). The first lower layer LPL1 may include the first lower side surface S1-Pa that defines the first lower region Ala of the first barrier wall opening OP-P1, and the second lower layer LPL2 may include the second lower side surface S2-Pa that defines the second lower region A2*a* of the first barrier wall opening OP-P1. The first lower side surface S1-Pa of the first lower layer LPL1 may be depressed in a direction away from the light emitting opening OP-E (or, the emissive region PXA defined by the light emitting opening OP-E) when compared to the second lower side surface S2-Pa of the second lower layer LPL2. Specifically, the first lower side surface S1-Pa may be depressed in the direction away from the light emitting opening when compared to the second lower side surface S2-Pa. That is, the first lower side surface S1-Pa may be undercut with respect to the second lower side surface S2-Pa.

FIG. 7A illustrates an example that the first and second lower side surfaces S1-Pa and S2-Pa are perpendicular to the upper surface of the pixel defining layer PDL. However, without being limited thereto, the first barrier wall PW1 may have a tapered shape, or may have an inverted tapered shape.

The cathode CE may make contact with the first lower layer LPL1. Specifically, the cathode CE may be brought into contact with the first lower side surface S1-Pa of the first lower layer LPL1. According to an embodiment of the present disclosure, the first barrier wall PW1 may receive the bias voltage. That is, the cathode CE may receive the bias voltage through electrical connection to the first lower layer LPL1 of the first barrier wall PW1.

Meanwhile, FIG. 7A illustrates an example that the emission pattern EP is not brought into contact with the first lower side surface S1-Pa of the first lower layer LPL1. However, without being limited thereto, the emission pattern EP, together with the cathode CE, may make contact with the first lower side surface S1-Pa of the first lower layer LPL1.

The second barrier wall opening OP-P2 defined in the second barrier wall PW2 may include the first upper region Alb as a third volume (refer to FIG. 8H) and the second upper region A2*b* as a fourth volume (refer to FIG. 8H) sequentially arranged in the third direction DR3. The first upper layer UPL1 may include the first upper side surface S1-Pb that defines the first upper region Alb of the second barrier wall opening OP-P2, and the second upper layer UPL2 may include the second upper side surface S2-Pb that defines the second upper region A2*b* of the second barrier wall opening OP-P2. The first upper side surface S1-Pb of the first upper layer UPL1 may be depressed in the direction away from the light emitting opening OP-E (or, the emissive region PXA defined by the light emitting opening OP-E) when compared to the second upper side surface S2-Pb of the second upper layer UPL2. Specifically, the first upper side surface S1-Pb may be depressed in the direction away from the light emitting opening when compared to the second upper side surface S2-Pb. That is, the first upper side surface S1-Pb may be undercut with respect to the second upper side surface S2-Pb.

FIG. 7A illustrates an example that the first and second upper side surfaces S1-Pb and S2-Pb are perpendicular to the upper surface of the pixel defining layer PDL. However, without being limited thereto, the second barrier wall PW2 may have a tapered shape, or may have an inverted tapered shape.

The lower inorganic encapsulation pattern LIL may make contact with the first lower side surface S1-Pa of the first barrier wall PW1 that defines the first barrier wall opening OP-P1 and the first upper side surface S1-Pb of the second barrier wall PW2 that defines the second barrier wall opening OP-P2 and may cover the first lower side surface S1-Pa and the first upper side surface S1-Pb. Specifically, a portion of the first lower side surface S1-Pa that is not brought into contact with the cathode CE may be covered by the lower inorganic encapsulation pattern LIL.

The lower inorganic encapsulation pattern LIL may cover a lower surface L-Pb of the second upper layer UPL2 exposed from the first dummy pattern DMP1 and connected with the second upper side surface S2-Pb. The lower inorganic encapsulation pattern LIL may cover a lower surface L-Pa of the second lower layer LPL2 exposed from the second dummy pattern DMP2 and connected with the second lower side surface S2-Pa.

The lower inorganic encapsulation pattern LIL may be disposed on the second barrier wall PW2 and may cover the first dummy pattern DMP1. The lower inorganic encapsulation pattern LIL may make contact with the inner surfaces of the first dummy pattern DMP1 that define the first dummy opening OP-D1. The lower inorganic encapsulation pattern LIL may cover the second dummy pattern DMP2 disposed on the second lower layer LPL2. The lower inorganic encapsulation pattern LIL may make contact with the inner surfaces of the first dummy pattern DMP1 that define the first dummy opening OP-D1 and the inner surfaces of the second dummy pattern DMP2 that define the second dummy opening OP-D2.

As the plurality of opening patterns OPT are formed in the second lower layer LPL2, a plurality of protruding patterns (or, depressed patterns) corresponding to the plurality of opening patterns OPT may be formed in or by the first upper layer UPL1, the second upper layer UPL2, and the first dummy pattern DMP1 together with a downward protruding pattern in the lower inorganic encapsulation pattern LIL, that are each disposed on the second lower layer LPL2. According to an embodiment of the present disclosure, the upper pattern UPT may be formed on the upper surface US of the second upper layer UPL2 to correspond to the plurality of opening patterns OPT.

As the upper pattern UPT is formed on the upper surface US of the second upper layer UPL2, a protruding pattern may be formed on the first dummy pattern DMP1 to correspond to the shape of the upper pattern UPT. That is, the first dummy pattern DMP1 may be disposed on the upper surface US of the second upper layer UPL2, and the upper pattern UPT formed on the upper surface US of the second upper layer UPL2 and the protruding pattern of the first dummy pattern DMP1 may be brought into direct contact with each other. In this case, the area by which the first dummy pattern DMP1 is brought into contact with the upper surface US of the second upper layer UPL2 (e.g., a contact area) may be increased as compared with when the upper pattern UPT is omitted from the upper surface US of the second upper layer UPL2 (e.g., having an increased flat portion or being entirely flat). Accordingly, even though moisture infiltrates between the first dummy pattern DMP1 and the second upper layer UPL2 or between the first dummy pattern DMP1 and the lower inorganic encapsulation pattern LIL, a path along which the infiltrating moisture is movable along the second barrier wall PW2 to the portion where the light emitting element ED is disposed may be lengthened, and thus the moisture may be prevented from infiltrating into the light emitting element ED. That is, the increased contact area at the depressed patterns increases a total length of a moisture path.

In this embodiment, the lower inorganic encapsulation pattern LIL may include an inorganic material. For example, the lower inorganic encapsulation pattern LIL may include silicon nitride $SiN_x$. According to an embodiment of the present disclosure, as all of the lower inorganic encapsulation pattern LIL, the second upper layer UPL2, and the second lower layer LPL2 include an inorganic material, the lower inorganic encapsulation pattern LIL may be brought into contact with the lower surface L-Pb of the second upper layer UPL2 and the lower surface L-Pa of the second lower layer LPL2 with high interfacial adhesive force. Accordingly, a phenomenon in which the lower inorganic encapsulation pattern LIL is lifted from the first barrier wall PW1 and the second barrier wall PW2 during a process of a method of forming the layered structure defining the emissive opening may be reduced or prevented. Thus, infiltration of moisture between the lower inorganic encapsulation pattern LIL and the first barrier wall PW1 and between the lower inorganic encapsulation pattern LIL and the second barrier wall PW2 may be reduced or prevented. In addition, even though moisture infiltrates between the lower inorganic encapsulation pattern LIL and the second upper layer UPL2, the infiltrating moisture may be prevented from moving along the lower surface L-Pb of the second upper layer UPL2 and the lower surface L-Pa of the second lower layer LPL2, and thus formation of a moisture infiltration path toward the light emitting element ED may be reduced or prevented.

According to an embodiment of the present disclosure, the second lower layer LPL2 and the second upper layer UPL2 may include different inorganic materials. Accordingly, in a process of patterning material layers for the second lower layer LPL2 and the second upper layer UPL2, the etch rates of respective the second lower layer LPL2 and the second upper layer UPL2 may differ from each other. Therefore, the first width d1 by which the first upper side surface S1-Pb is depressed from the second upper side surface S2-Pb may differ from the second width d2 by which the first lower side surface S1-Pa is depressed from the second lower side surface S2-Pa. That is, the protruding length of the first tip portion TP1 may differ from the protruding length of the second tip portion TP2.

Specifically, the first width d1 by which the first upper side surface S1-Pb is depressed from the second upper side surface S2-Pb may be greater than the second width d2 by which the first lower side surface S1-Pa is depressed from the second lower side surface S2-Pa. In the present disclosure, the second width d2 by which the first lower side surface S1-Pa is depressed from the second lower side surface S2-Pa may be smaller than the first width d1 by which the first upper side surface S1-Pb is depressed from the second upper side surface S2-Pb, and thus the lower inorganic encapsulation pattern LIL may be formed in direct contact with the lower surface L-Pb of the second upper layer UPL2 and the first upper side surface S1-Pb that are adjacent to the second dummy pattern DMP2. Here, the infiltrating moisture may be prevented from moving along the lower surface La-Pb of the second upper layer UPL2*a* and the lower surface La-Pa of the second lower layer LPL2*a*. Accordingly, infiltration of moisture between the lower inorganic encapsulation pattern LIL and the second barrier wall PW2 may be reduced or prevented.

Referring to FIG. 7B, a first barrier wall PW1*a* may include a first lower layer LPL1*a* and a second lower layer LPL2*a*. The first lower layer LPL1*a* may include a first lower side surface S1*a*-Pa that defines the first lower region Ala (refer to FIG. 8H), and the second lower layer LPL2*a* may include a second lower side surface S2*a*-Pa that defines the second lower region A2*a* (refer to FIG. 8H). The first lower layer LPL1*a* may be relatively depressed with respect to the emissive region PXA (refer to FIG. 6) when compared to the second lower layer LPL2*a*. That is, the first lower layer LPL1*a* may be undercut with respect to the second lower layer LPL2*a*. A first tip portion TP1*a* may be defined by a portion of the second lower layer LPL2*a* that protrudes from the first lower layer LPL1*a* toward the emissive region PXA.

A second barrier wall PW2*a* may include a first upper layer UPL1*a* and a second upper layer UPL2*a*. The first upper layer UPL1*a* may include a first upper side surface S1*a*-Pb that defines the first upper region Alb (refer to FIG. 8H), and the second upper layer UPL2*a* may include a second upper side surface S2*a*-Pb that defines the second upper region A2*b* (refer to FIG. 8H). The first upper layer UPL1*a* may be relatively depressed with respect to the emissive region PXA when compared to the second upper layer UPL2*a*. That is, the first upper layer UPL1*a* may be undercut with respect to the second upper layer UPL2*a*. A second tip portion TP2*a* may be defined by a portion of the second upper layer UPL2*a* that protrudes from the first upper layer UPL1*a* toward the emissive region PXA.

Each of the second lower layer LPL2*a* and the second upper layer UPL2*a* may include an inorganic material. For example, each of second lower layer LPL2*a* and the second upper layer UPL2*a* may include at least one of silicon nitride ($SiN_x$), silicon oxide ($SiO_2$), silicon oxy-nitride (SiON) and aluminum oxide ($AL_2O_3$). However, without being limited thereto, each of the second lower layer LPL2*a* and the second upper layer UPL2*a* may include titanium (Ti). According to an embodiment of the present disclosure, the second lower layer LPL2*a* and the second upper layer UPL2*a* may include the same material. As the second lower layer LPL2*a* and the second upper layer UPL2*a* include the same material, the etch rates of the second lower layer LPL2*a* and the second upper layer UPL2*a* may be equal to each other, and thus the second lower side surface S2*a*-Pa and the second upper side surface S2*a*-Pb may be formed side by side on the same line in the third direction DR3.

Each of the first lower layer LPL1*a* and the first upper layer UPL1*a* may include a conductive material. For example, each of the first lower layer LPL1*a* and the first upper layer UPL1*a* may include a metallic material, an alloy material, or metal nitride. According to an embodiment of the present disclosure, the first lower layer LPL1*a* and the first upper layer UPL1*a* may include different materials. Specifically, the first upper layer UPL1*a* may include at least one of aluminum (Al) and molybdenum (Mo). The first lower layer LPL1*a* may include an aluminum (Al) alloy when the first upper layer UPL1*a* includes aluminum (Al) and may include a molybdenum (Mo) alloy when the first upper layer UPL1*a* includes molybdenum (Mo).

As the first lower layer LPL1*a* and the first upper layer UPL1*a* include different materials, the etch rates of the first lower layer LPL1*a* and the first upper layer UPL1*a* may differ from each other in a process for the first lower layer LPL1*a* and the first upper layer UPL1*a*, and therefore the first width d1*a* by which the first upper side surface S1*a*-Pb is depressed from the second upper side surface S2*a*-Pb may differ from the second width d2*a* by which the first lower side surface S1*a*-Pa is depressed from the second lower side surface S2*a*-Pa. Specifically, the second width d2*a* by which the first lower side surface S1*a*-Pa is depressed from the second lower side surface S2*a*-Pa may be greater than the first width d1*a* by which the first upper side surface S1*a*-Pb is depressed from the second upper side surface S2*a*-Pb. In the present disclosure, as the second width d2*a* by which the first lower side surface S1*a*-Pa is depressed from the second lower side surface S2*a*-Pa is formed to be large, a lower surface La-Pa of the second lower layer LPL2*a* in contact with the lower inorganic encapsulation pattern LIL may be increased. By the lower surface La-Pa of the second lower layer LPL2*a* and a lower surface La-Pb of the second upper layer UPL2*a*, a moisture infiltration path to the light emitting element ED may be lengthened. Thus, infiltration of moisture into the light emitting element ED may be prevented, and the display panel DP (refer to FIG. 6) having improved process reliability and reduced defects may be provided.

Figure 8A:
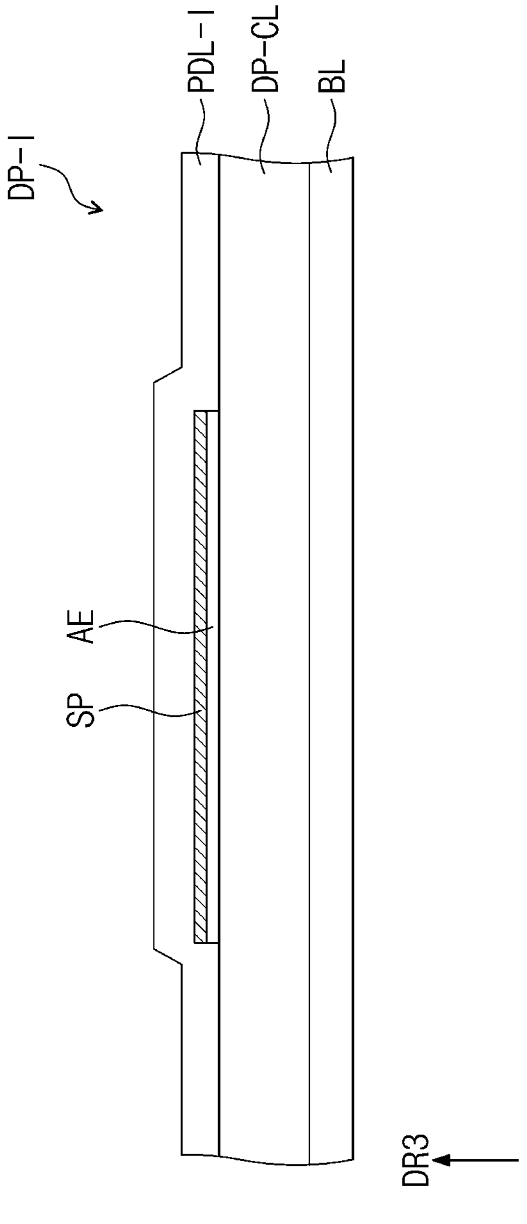
FIGS. 8A to 8N are cross-sectional views illustrating structures provided in a display panel manufacturing method according to an embodiment of the present disclosure.
Figure 8B:
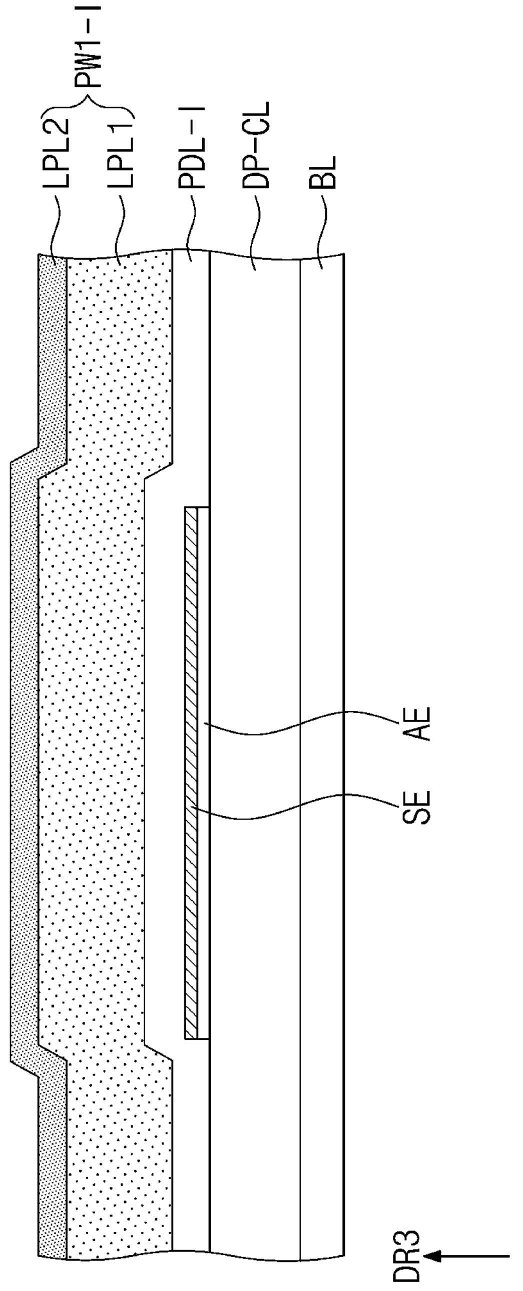
Figure 8C:
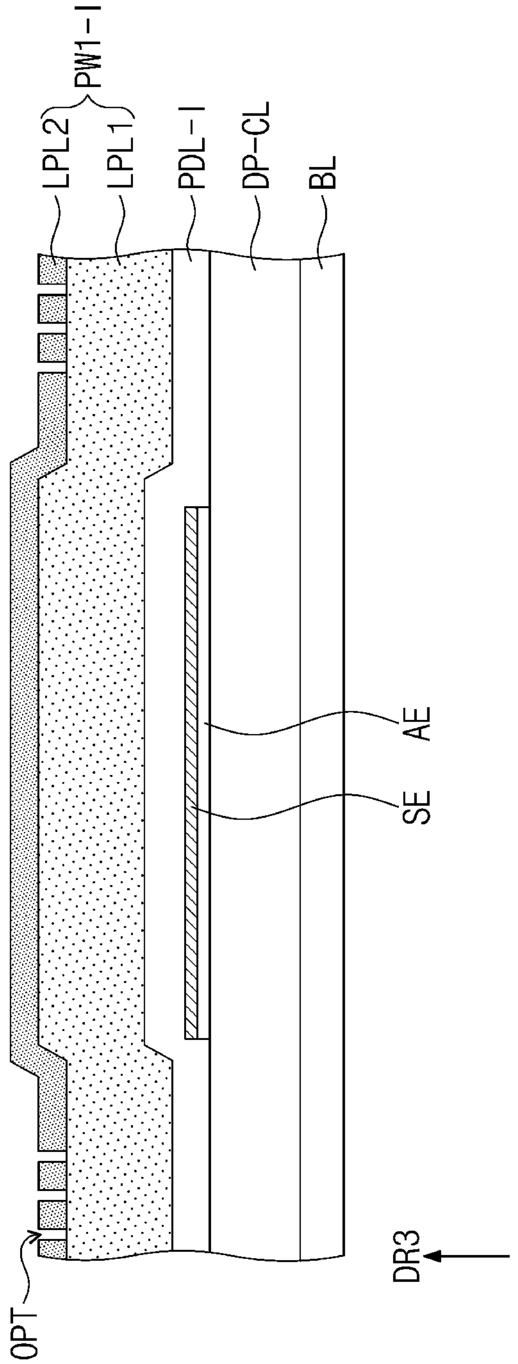
Figure 8D:
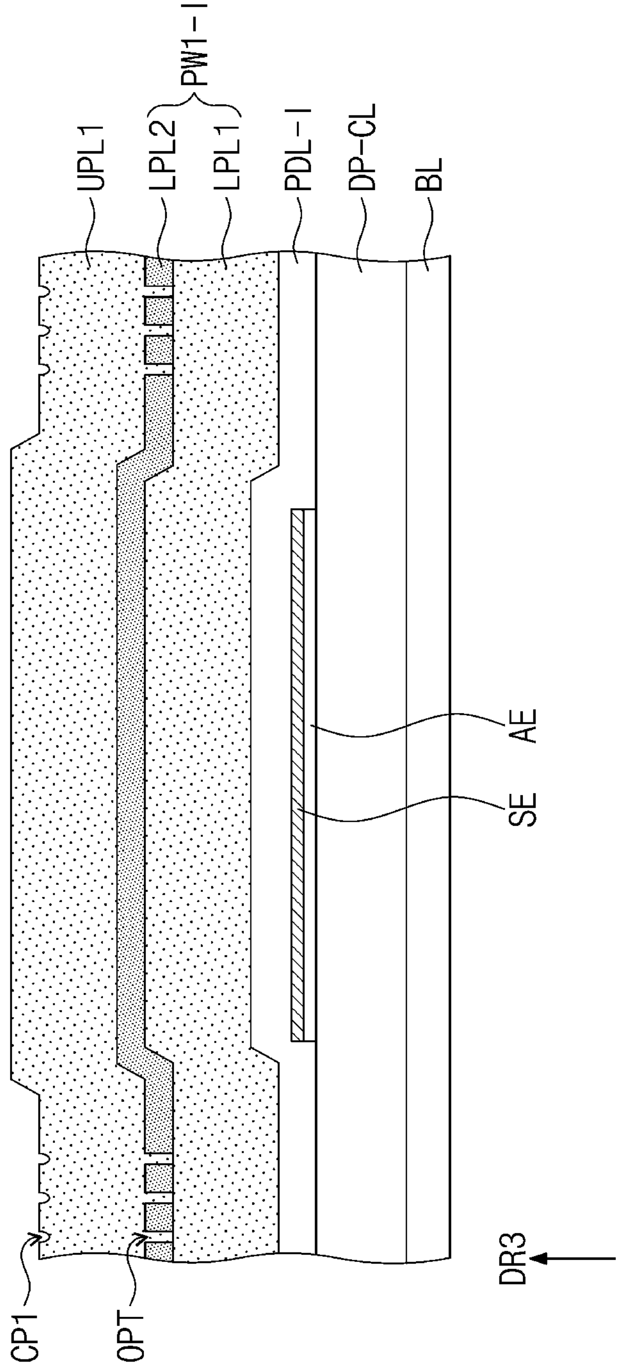
Figure 8E:
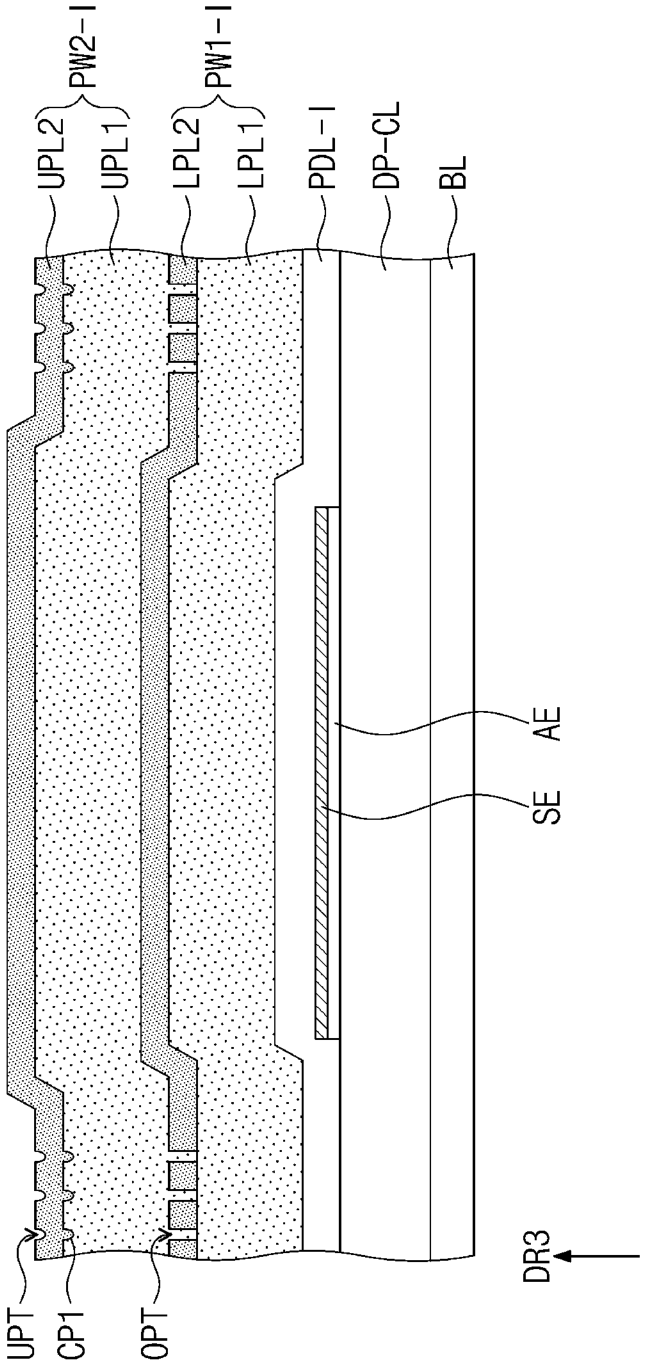
Figure 8F:
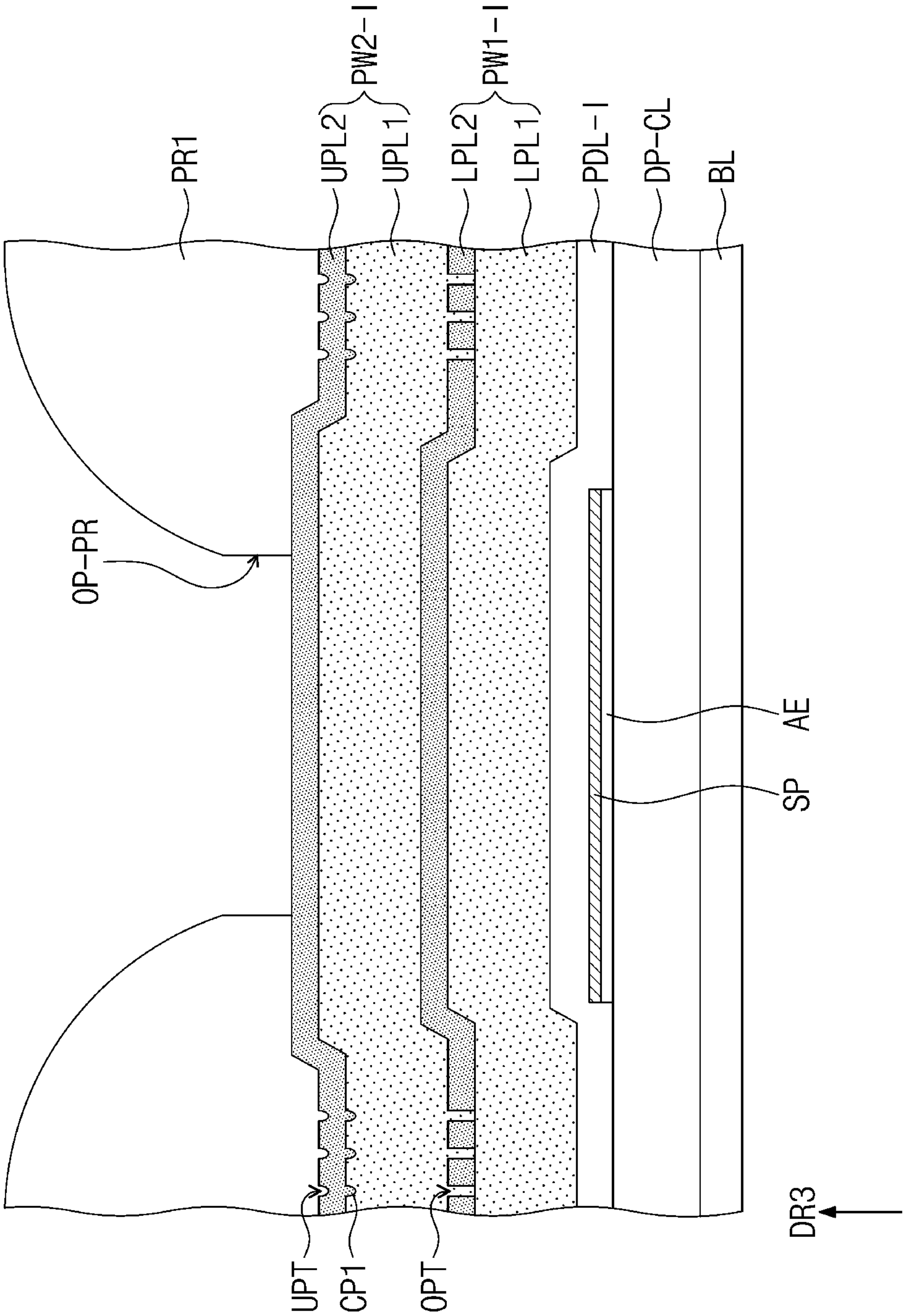
Figure 8G:
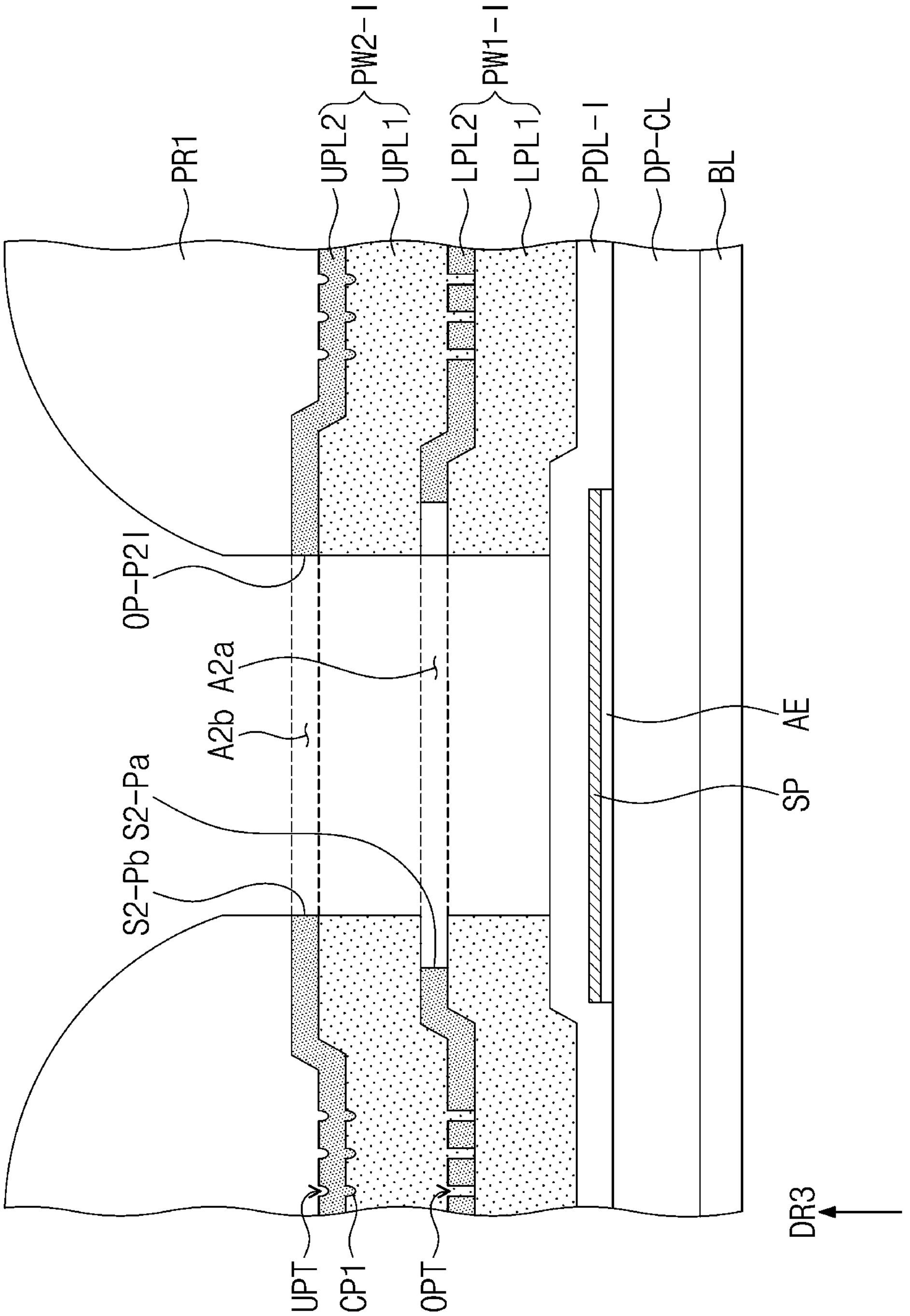
Figure 8H:
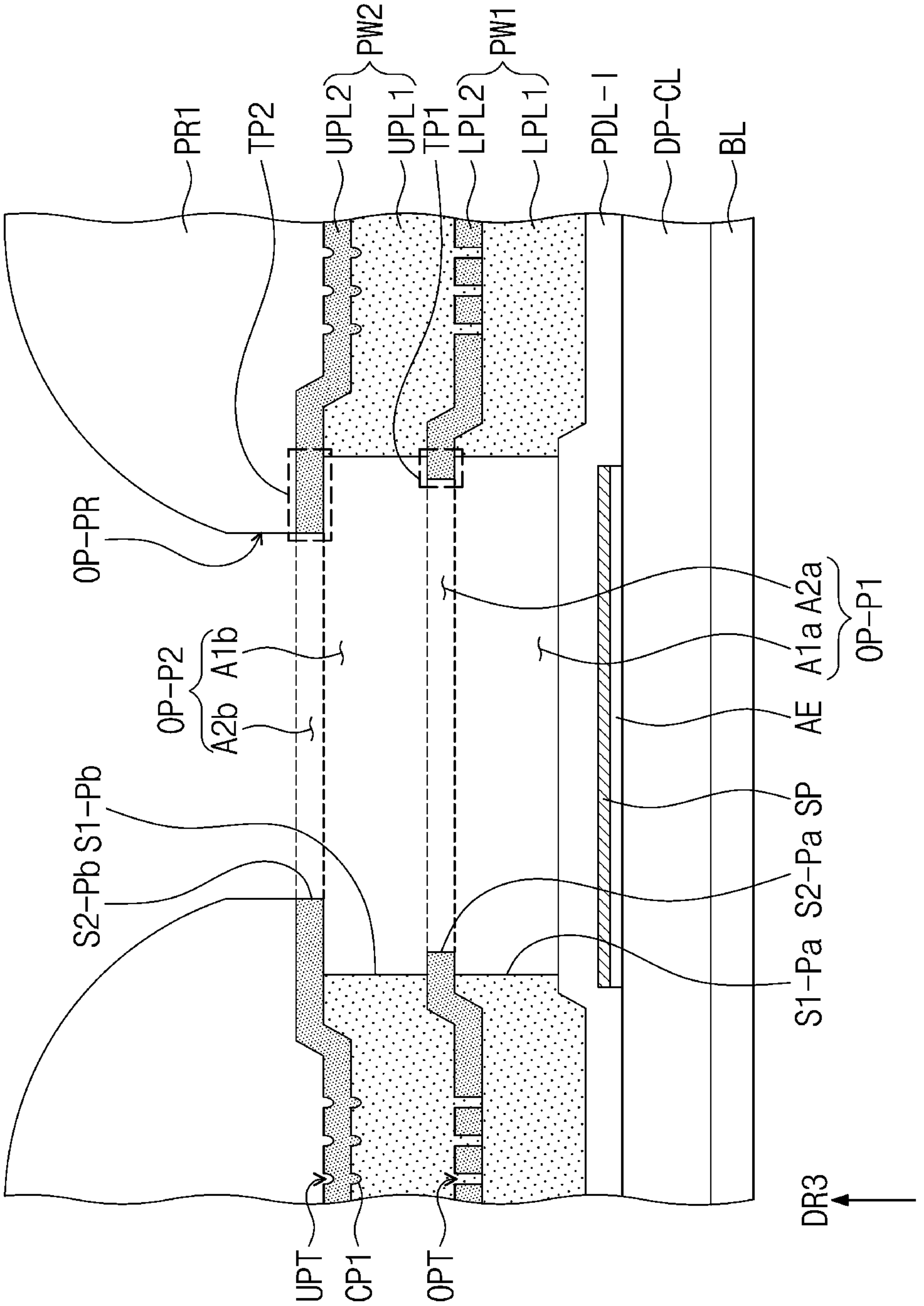
Figure 8I:
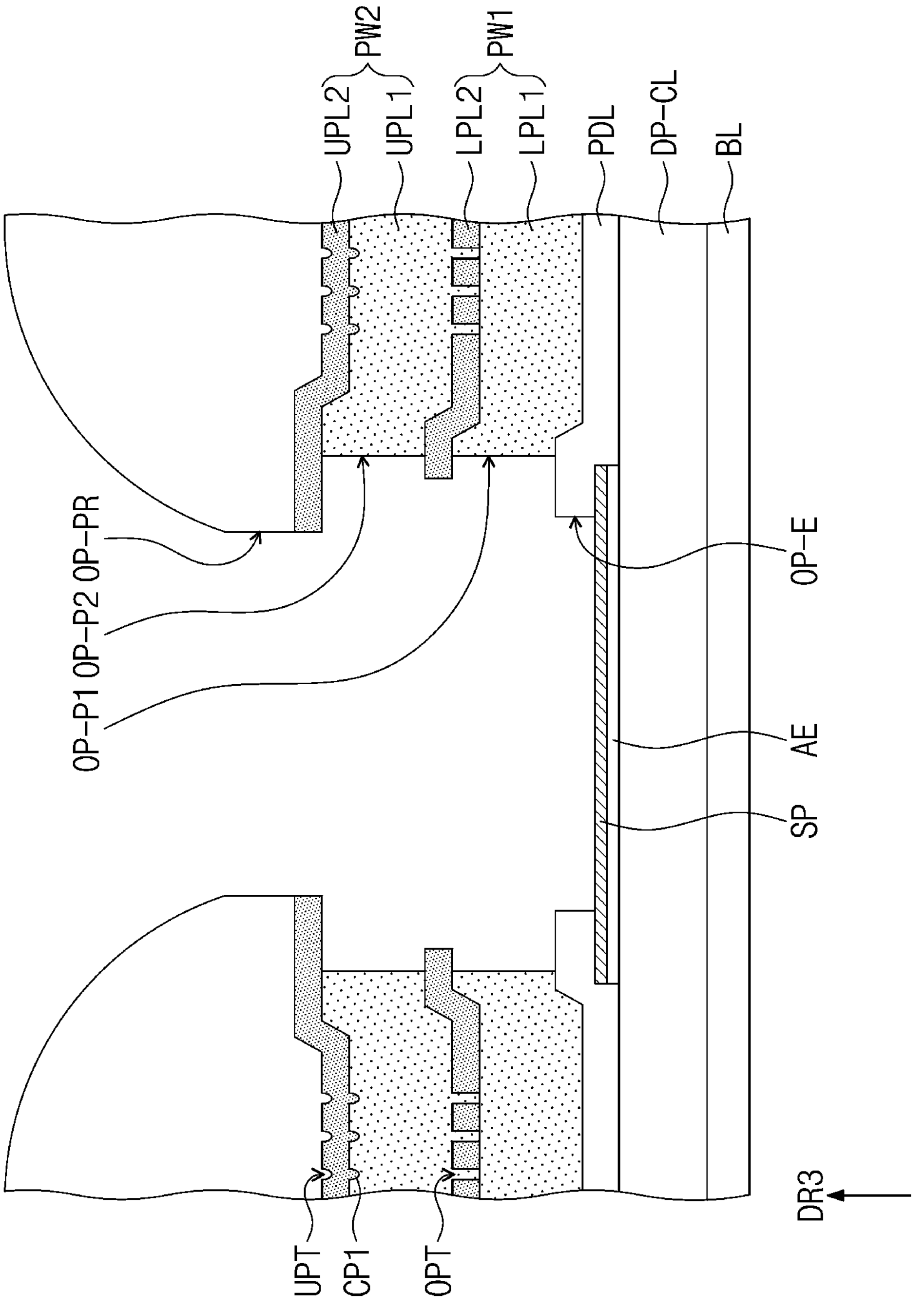
Figure 8J:
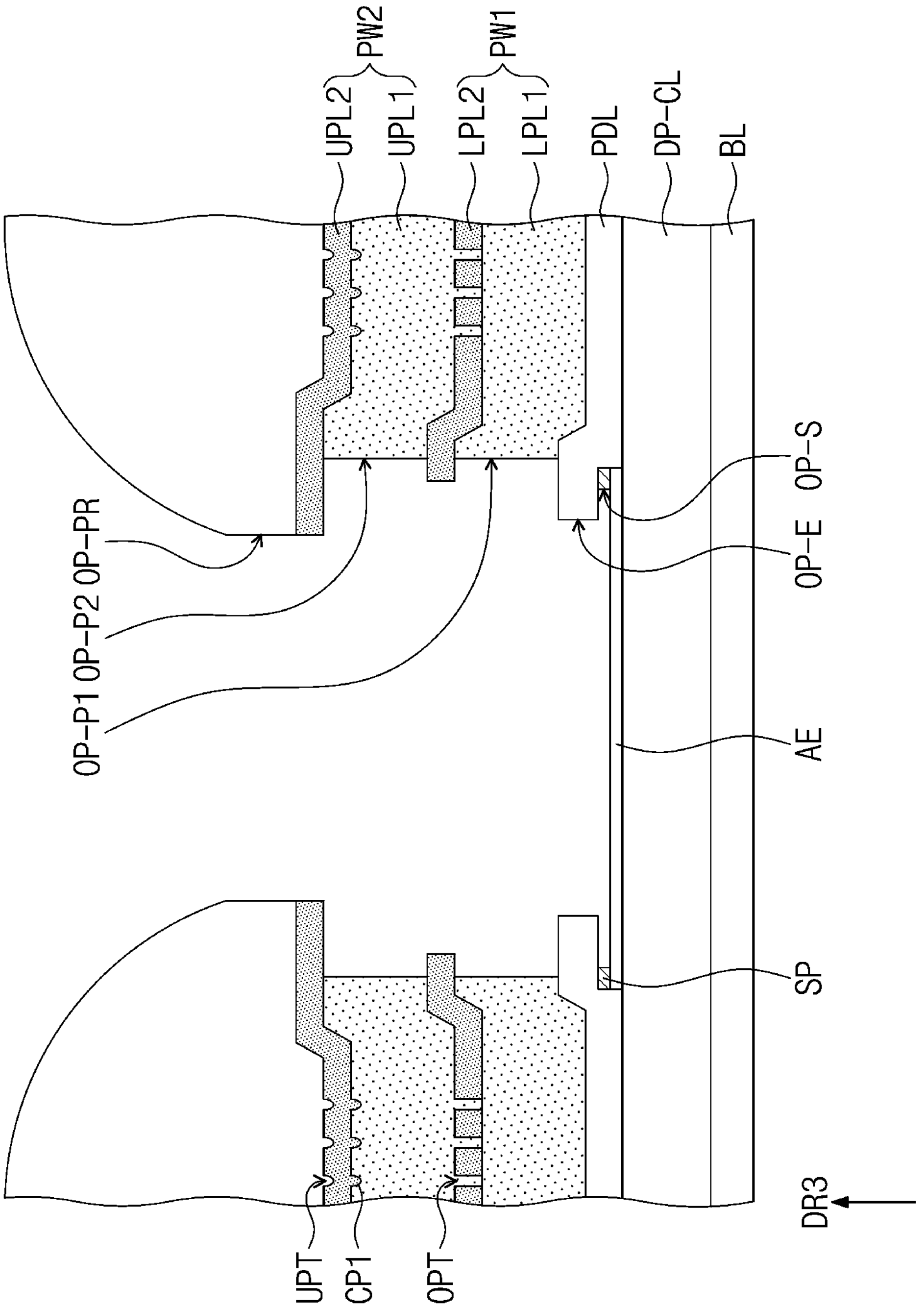
Figure 8K:
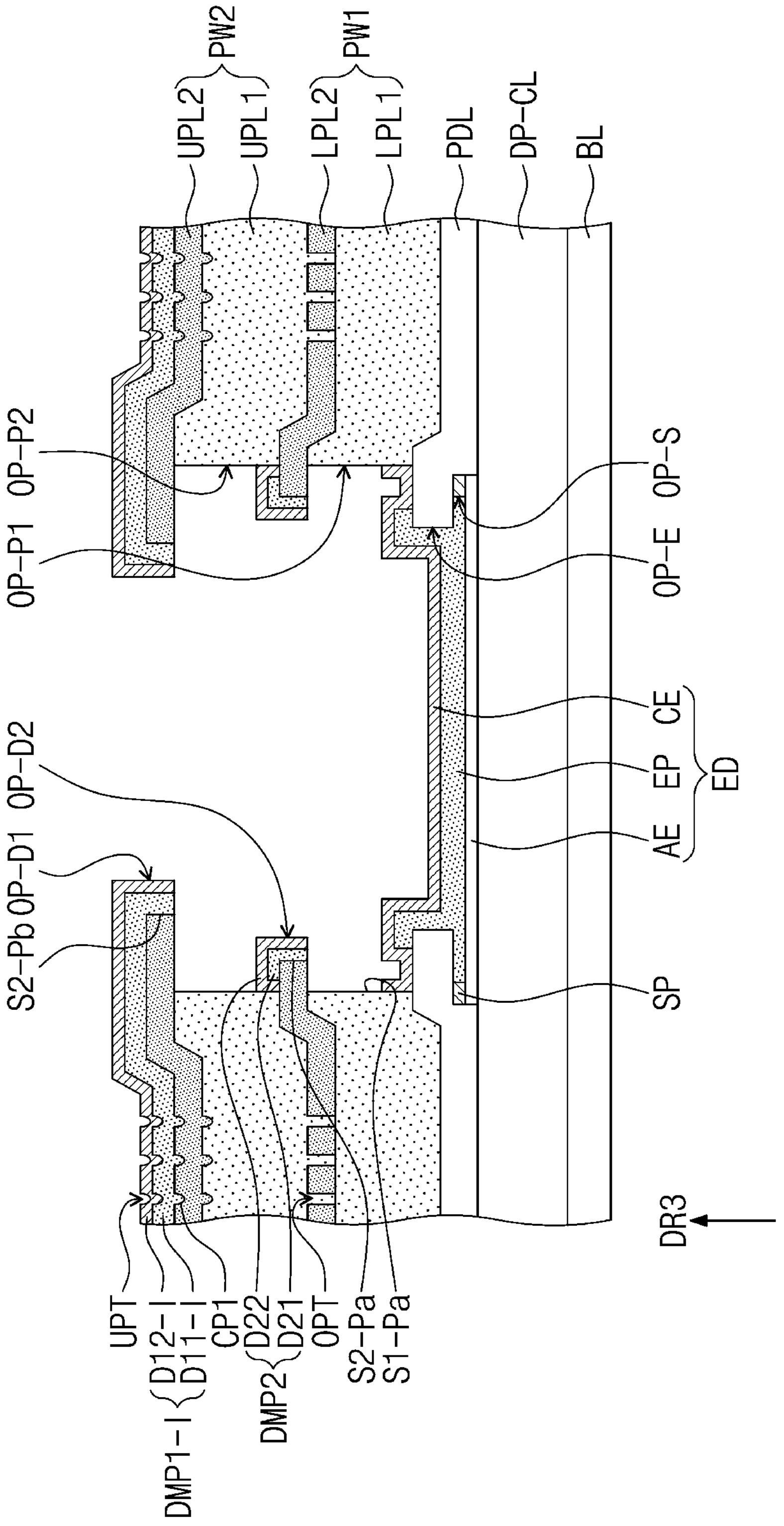
Figure 8L:
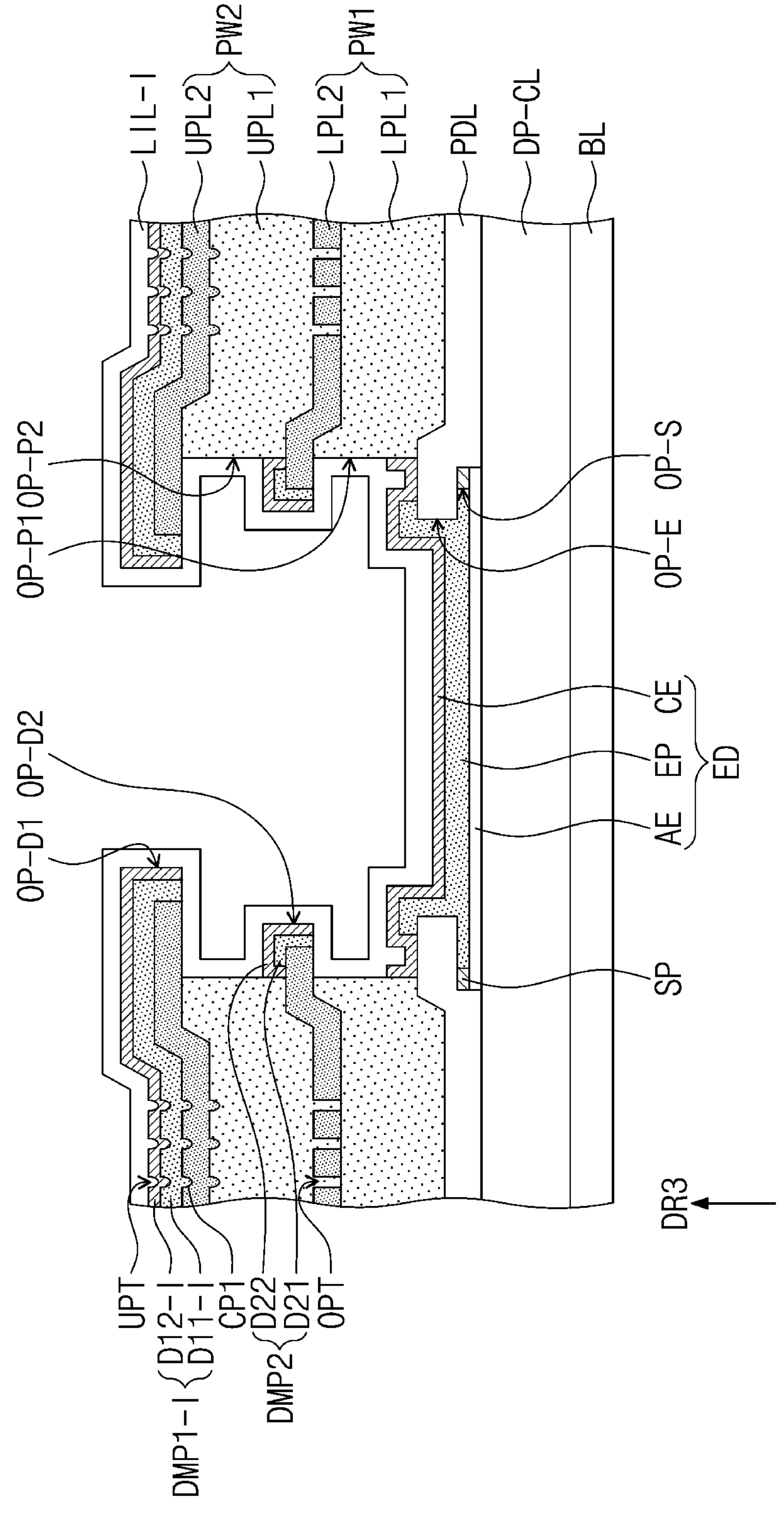
Figure 8M:
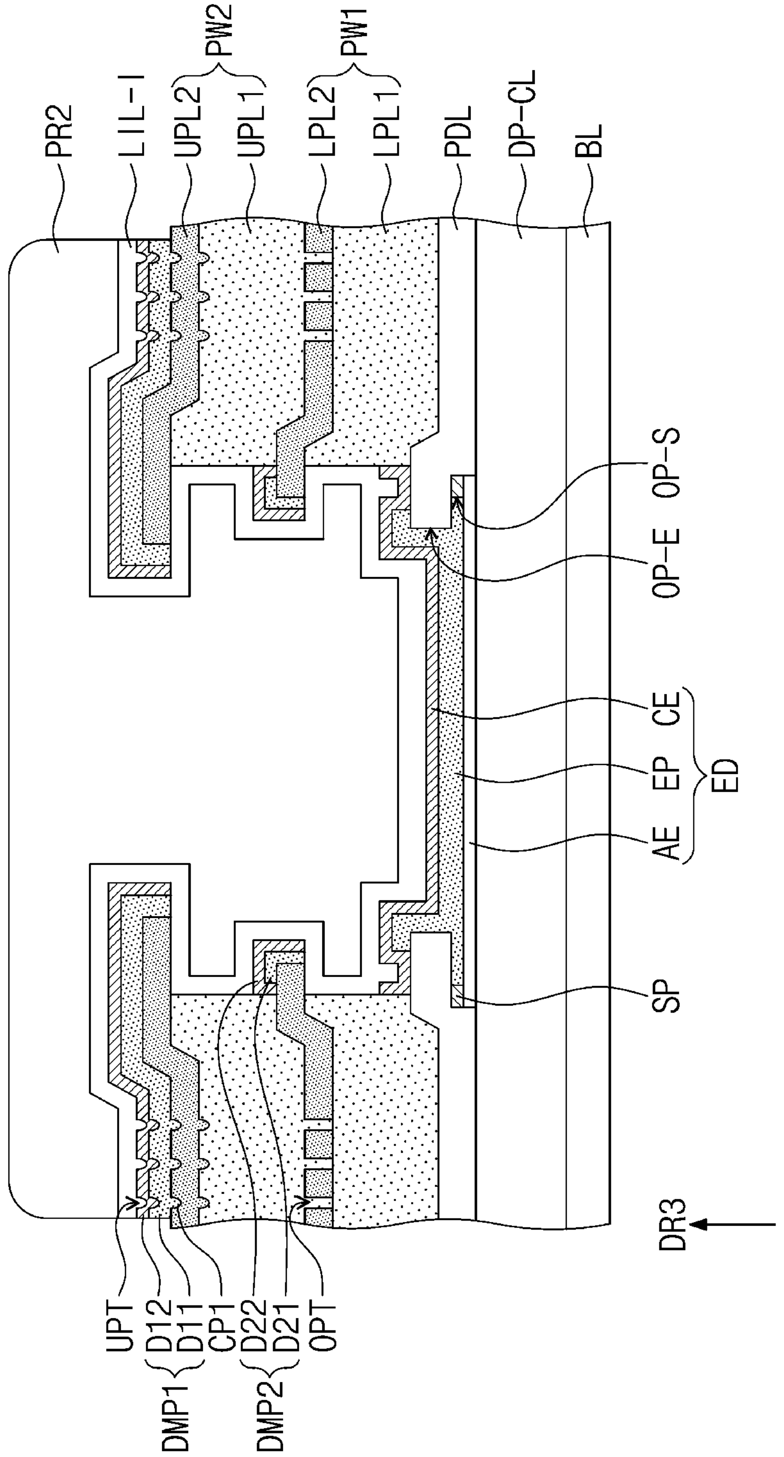
Figure 8N:
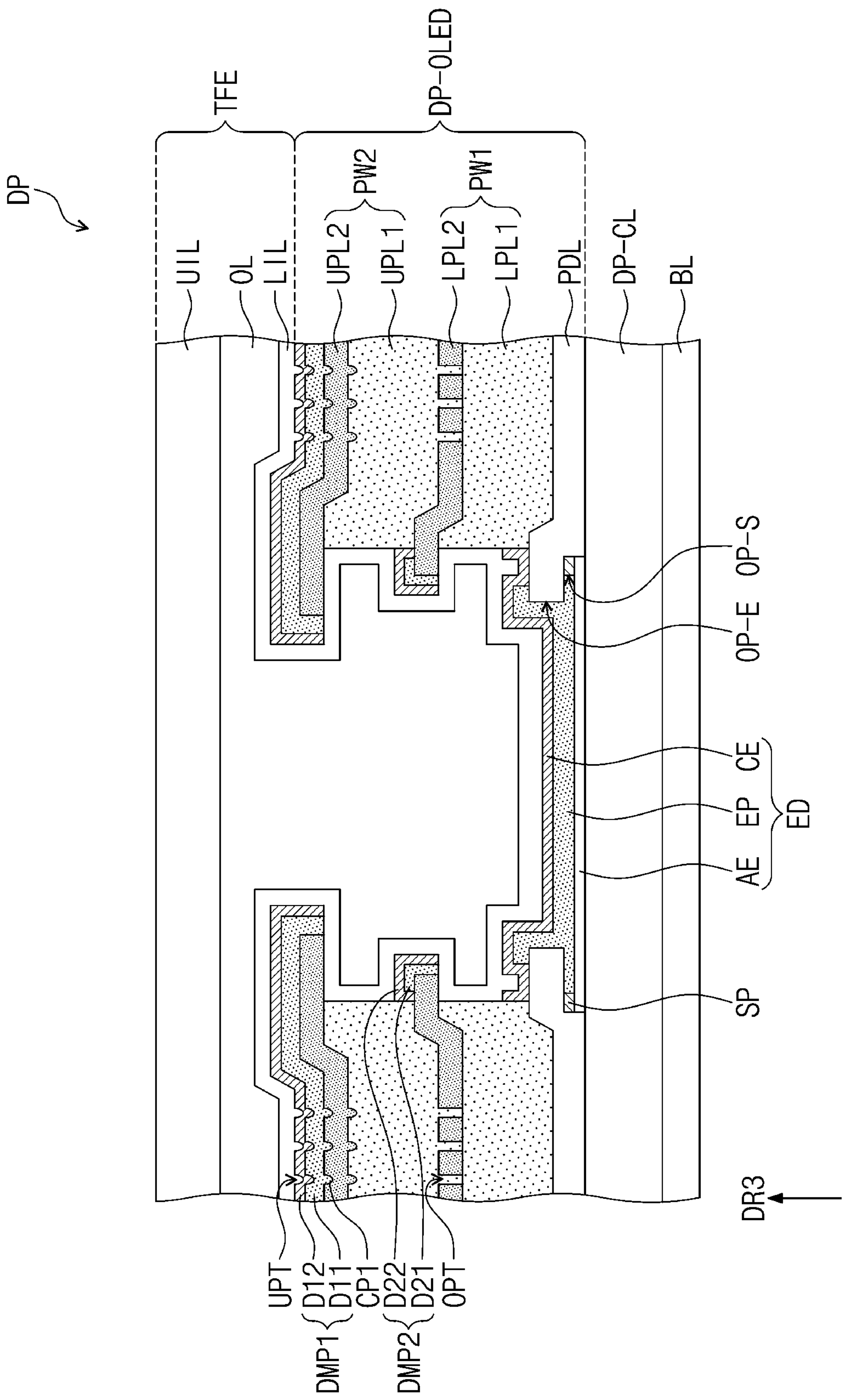

FIGS. 8A to 8N are sectional views illustrating structures in processes in a display panel manufacturing method according to an embodiment of the present disclosure. In describing the display panel manufacturing method with reference to FIGS. 8A to 8N, components identical/similar to the components described with reference to FIGS. 1 to 7B will be assigned with identical/similar reference numerals, and repetitive descriptions will be omitted.

The display panel manufacturing method according to the present disclosure includes a process of providing a preliminary display panel including a base layer, a first electrode disposed on the base layer, and a preliminary pixel defining layer that is disposed on the base layer and that covers the first electrode, a process of forming, on the preliminary pixel defining layer, a first preliminary barrier wall including a first lower layer and a second lower layer disposed on the first lower layer, a process of forming a plurality of opening patterns in the second lower layer, a process of forming, on the second lower layer, a second preliminary barrier wall electrically connected with the first lower layer through the opening patterns, a process of patterning the first preliminary barrier wall and the second preliminary barrier wall to form a first barrier wall having a first barrier wall opening defined therein and a second barrier wall having a second barrier wall opening defined therein, a process of forming an emission pattern on the first electrode, and a process of forming, on the emission pattern, a second electrode making contact with the first barrier wall.

Hereinafter, a method of forming (or providing) one light emitting element ED (refer to FIG. 8N) and one lower inorganic encapsulation pattern LIL (refer to FIG. 8N) that covers the light emitting element ED will be described with reference to FIGS. 8A to 8N.

Referring to FIG. 8A, the display panel manufacturing method according to this embodiment may include a process of providing a preliminary display panel DP-I. The preliminary display panel DP-I provided in this embodiment may include the base layer BL, the circuit element layer DP-CL, the anode AE, the sacrificial pattern SP as a preliminary sacrificial pattern or sacrificial layer, and a preliminary pixel defining layer PDL-I.

The circuit element layer DP-CL may be formed through a conventional circuit element manufacturing process of forming an insulating layer, a semiconductor layer, and a conductive layer by coating, deposition, or the like and forming a semiconductor pattern, a conductive pattern, and a signal line by selectively making the insulating layer, the semiconductor layer, and the conductive layer subject to patterning by photolithography and etching processes.

The anode AE and the sacrificial pattern SP may be formed by the same patterning process. The same process may provide aligned end surfaces as show in FIG. 8A, without being limited thereto. The preliminary pixel defining layer PDL-I may cover both the anode AE and the sacrificial pattern SP.

Referring to FIG. 8B, the display panel manufacturing method according to this embodiment may include a process of forming, on the preliminary pixel defining layer PDL-I, a first preliminary barrier wall layer PW1-I including the first lower layer LPL1 and the second lower layer LPL2 in preliminary forms.

The process of forming the first preliminary barrier wall layer PW1-I may include a process of forming, on the preliminary pixel defining layer PDL-I, the first lower layer LPL1 including a conductive material and a process of forming, on the first lower layer LPL1, the second lower layer LPL2 including an inorganic material.

The process of forming the first lower layer LPL1 may be performed by a process of depositing the conductive material. In an embodiment of the present disclosure, the conductive material may include metal. Specifically, the first lower layer LPL1 may include molybdenum (Mo). For example, the process of forming the first lower layer LPL1 may be performed by a sputtering deposition process.

The process of forming the second lower layer LPL2 may be performed by a process of depositing the inorganic material. In an embodiment of the present disclosure, the second lower layer LPL2 may include at least one of silicon nitride ($SiN_x$), silicon oxide ($SiO_2$), silicon oxy-nitride (SiON) and aluminum oxide ($AL_2O_3$). Specifically, the second lower layer LPL2 may include silicon nitride ($SiN_x$). For example, the process of forming the second lower layer LPL2 may be performed by a chemical vapor deposition (CVD) process or an atomic layer deposition (ALD) process.

Referring to FIG. 8C, the display panel manufacturing method according to this embodiment may include a process of forming the plurality of opening patterns OPT in the second lower layer LPL2. The plurality of opening patterns OPT may correspond to through-holes penetrating completely through a thickness of the second lower layer LPL2. According to an embodiment of the present disclosure, the process of forming the plurality of opening patterns OPT may be performed by a dry etch process. Although six opening patterns OPT are illustrated in FIG. 8C (e.g., three through-holes on each of opposing sides of an emission opening), six or more opening patterns OPT may be formed. The plurality of opening patterns OPT may have a closed-line shape surrounding the corresponding emissive region PXA (refer to FIG. 4) on the plane (e.g., in the plan view).

Referring to FIGS. 8D and 8E, the display panel manufacturing method according to this embodiment may include a process of forming, on the first preliminary barrier wall layer PW1-I, a second preliminary barrier wall layer PW2-I including the first upper layer UPL1 and the second upper layer UPL2.

The process of forming the second preliminary barrier wall layer PW2-I may include a process of forming, on the first preliminary barrier wall layer PW1-I, the first upper layer UPL1 including a conductive material and a process of forming, on the first upper layer UPL1, the second upper layer UPL2 including an inorganic material.

Referring to FIG. 8D, the process of forming the first upper layer UPL1 may be performed by a process of depositing the conductive material. In an embodiment of the present disclosure, the conductive material may include metal. The first upper layer UPL1 may include the same material as the first lower layer LPL1. Specifically, the first upper layer UPL1 may include molybdenum (Mo). For example, the process of forming the first upper layer UPL1 may be performed by a sputtering deposition process.

The first upper layer UPL1 may make direct contact with the first lower layer LPL1 through (or at) the plurality of opening patterns OPT. Specifically, the first upper layer UPL1 may be electrically connected with the first lower layer LPL1 by making contact with the first lower layer LPL1 through the plurality of opening patterns OPT. In the sputtering deposition process, a first depression pattern CP1 corresponding to the plurality of opening patterns OPT may be formed on the upper surface of the first upper layer UPL1. That is, the conductive material layer of the first upper layer UPL1 which is respectively above the opening patterns OPT may sink or extend into the opening patterns OPT to form the first depression pattern CP1 provided in plural including a plurality of first depression patterns CP1. The first depression pattern CP1 may be defined at the upper surface of the first upper layer UPL1 which is furthest from the base layer BL, where the upper surface includes a flat portion extending from the first depression patterns CP1 and a recessed portion which is respective at the first depression patterns CP1.

Referring to FIG. 8E, the process of forming the second upper layer UPL2 may be performed by a process of depositing the inorganic material. In an embodiment of the present disclosure, the second upper layer UPL2 may include at least one of silicon nitride ($SiN_x$), silicon oxide ($SiO_2$), silicon oxy-nitride (SiON) and aluminum oxide ($AL_2O_3$). The second upper layer UPL2 may include a material different from that of the second lower layer LPL2. Specifically, the second upper layer UPL2 may include silicon oxide ($SiO_2$). For example, the process of forming the second upper layer UPL2 may be performed by a chemical vapor deposition (CVD) process or an atomic layer deposition (ALD) process.

The second upper layer UPL2 may make direct contact with the first upper layer UPL1. A first protruding pattern may be formed at the lower surface of the second upper layer UPL2 to correspond to the first depression pattern CP1 formed on the upper surface of the first upper layer UPL1. The first protruding pattern of the second upper layer UPL2 and the first depression pattern CP1 may be engaged with each other such as to have corresponding cross-sectional shapes, and the second upper layer UPL2 may make direct contact with the first upper layer UPL1. According to an embodiment of the present disclosure, the upper pattern UPT including a second depression pattern provided in plural including a plurality of second depression patterns may be formed at the upper surface of the second upper layer UPL2. The upper pattern UPT may have a shape depressed in the direction opposite to the third direction DR3 to correspond to the first protruding pattern. The upper pattern UPT corresponding to the plurality of opening patterns OPT may be formed at the upper surface of the second upper layer UPL2 in the process in which the second upper layer UPL2 is formed. The upper pattern UPT may have a closed-line shape surrounding the corresponding emissive region PXA (refer to FIG. 4) on the plane. That is, the inorganic material layer of the second upper layer UPL2 which is respectively above the first depression patterns CP1 may sink or extend into the first depression patterns to form the second depression patterns.

Referring to FIG. 8F, the display panel manufacturing method according to this embodiment may include a process of forming a first photoresist layer PR1 on the second preliminary barrier wall layer PW2-I. The first photoresist layer PR1 may be formed by forming a preliminary photoresist material layer on the second preliminary barrier wall layer PW2-I and thereafter patterning the preliminary photoresist material layer by using a photo mask. Through the patterning process, a photo opening OP-PR overlapping the anode AE may be formed in the first photoresist layer PR1.

Referring to FIGS. 8G and 8H, the display panel manufacturing method according to this embodiment may include a process of patterning the first preliminary barrier wall layer PW1-I and the second preliminary barrier wall layer PW2-I to form the first barrier wall PW1 and the second barrier wall PW2 from the first preliminary barrier wall layer PW1-I and the second preliminary barrier wall layer PW2-I.

As illustrated in FIG. 8G, the process of patterning the first preliminary barrier wall layer PW1-I and the second preliminary barrier wall layer PW2-I may include a first etching process of firstly etching the first lower layer LPL1, the second lower layer LPL2, the first upper layer UPL1, and the second upper layer UPL2. The first lower layer LPL1, the second lower layer LPL2, the first upper layer UPL1, and the second upper layer UPL2 may be etched together with each other within the first etching. In the first etching process, a second preliminary barrier wall opening OP-P2I (or, a preliminary upper barrier wall opening) may be formed at the second preliminary barrier wall layer PW2-I by using the first photoresist layer PR1 as a mask. The first etching process may be performed by a dry etch process. In FIG. 8G, a preliminary barrier wall opening may include the respective sidewalls of the first lower layer LPL1, the second lower layer LPL2, the first upper layer UPL1 and the second upper layer UPL2 together with each other, where such sidewalls are provided by a first etching of the aforementioned layers.

The first etching process in this embodiment may be performed in an environment in which the etch selectivity between the second lower layer LPL2 and the second upper layer UPL2 is high. Specifically, the second lower layer LPL2 may be mainly etched (e.g., etched more or more material removed) since the etch rate of the second upper layer UPL2 by an etching solution is higher than the etch rate of the second lower layer LPL2 by the etching solution. Accordingly, the inner surface of the second upper layer UPL2 and the inner surface of the second lower layer LPL2 may not be aligned with each other in the third direction DR3 in forming the preliminary barrier wall opening. The second upper layer UPL2 may include the second upper side surface S2-Pb that defines the second upper region A2*b*, and the second lower layer LPL2 may include the second lower side surface S2-Pa that defines the second lower region A2*a*. Thus, the second lower side surface S2-Pa of the second lower layer LPL2 may be depressed inward when compared to the second upper side surface S2-Pb of the second upper layer UPL2.

The second upper region A2*b*, and the second lower region A2*a* indicated in FIG. 8G may have a thickness dimension along the third direction DR3, and a planar dimension along the first direction DR1 and the second direction DR2. The various regions may essentially be a volume region, defined by the planar and thickness dimensions. The respective thickness dimension may define a thickness portion (or volume portion) of corresponding emissive opening having a total volume (or a total depth) by a sum of all of the volume regions at different layers defining the emissive opening.

As illustrated in FIG. 8H, the process of patterning the first lower layer LPL1 and the first upper layer UPL1 may include a second etching process of secondly etching the first lower layer LPL1 and the first upper layer UPL1. In the second etching process, the second barrier wall opening OP-P2 (or, the upper barrier wall opening) may be formed from the second preliminary barrier wall opening OP-P2I by using the first photoresist layer PR1 as a mask. The second etching process may be performed by a dry etch process or a wet etch process. For example, in the second etching process, the dry etch process may be performed by using hydrogen fluoride, and the wet etch process may be performed by using bromine water.

The second etching process in this embodiment may be performed in an environment in which the etch selectivity between the first lower and upper layers LPL1 and UPL1 and the etch selectivity between the second lower and upper layers LPL2 and UPL2 are high. Accordingly, the inner surface of the second barrier wall PW2 that defines the second barrier wall opening OP-P2 and the inner surface of the first barrier wall PW1 that defines the first barrier wall opening OP-P1 may have an undercut shape on the section. Specifically, the first upper layer UPL1 and the first lower layer LPL1 may be mainly etched since the etch rate of the first upper layer UPL1 by an etching solution is higher than the etch rate of the second upper layer UPL2 and the etch rate of the first lower layer LPL1 is higher than the etch rate of the second lower layer LPL2. In this case, depending on conditions of the second etching process, the second lower layer LPL2 and the second upper layer UPL2 may be partially etched together with the first lower layer LPL1 and the first upper layer UPL1, or may not be etched.

When the second etching process is completed, the first lower layer LPL1 may include the first lower side surface S1-Pa that defines a thickness dimension of the first lower region Ala of the first barrier wall opening OP-P1, and the first upper layer UPL1 may include the first upper side surface S1-Pb that defines a thickness dimension of the first upper region Alb of the second barrier wall opening OP-P2. Where the various wall openings are considered to include two volume regions together, the wall openings may have a maximum planar dimension at the first layers LPL1 and UPL1) and a minimum planar dimension at the second layers (LPL2 and UPL2).

In an embodiment of the present disclosure, in the process of patterning the first preliminary barrier wall layer PW1-I and the second preliminary barrier wall layer PW2-I, the second etching process of secondly etching only the first lower layer LPL1 and the first upper layer UPL1 may be performed after the first etching process of firstly etching each of the first lower layer LPL1, the second lower layer LPL2, the first upper layer UPL1, and the second upper layer UPL2.

Figure 9A:
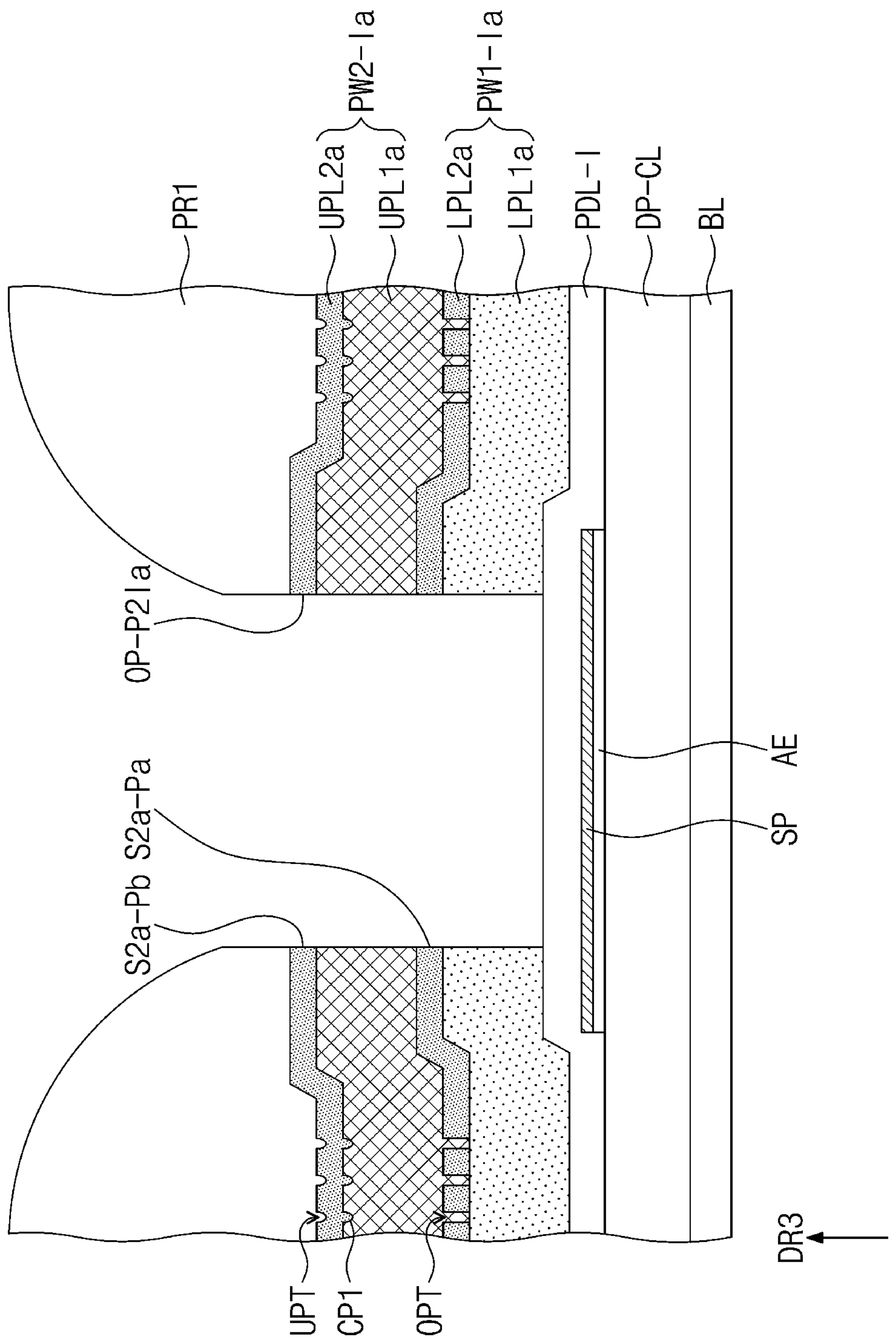
FIGS. 9A and 9B are cross-sectional views illustrating structures provided in a display panel manufacturing method according to an embodiment of the present disclosure.
Figure 9B:
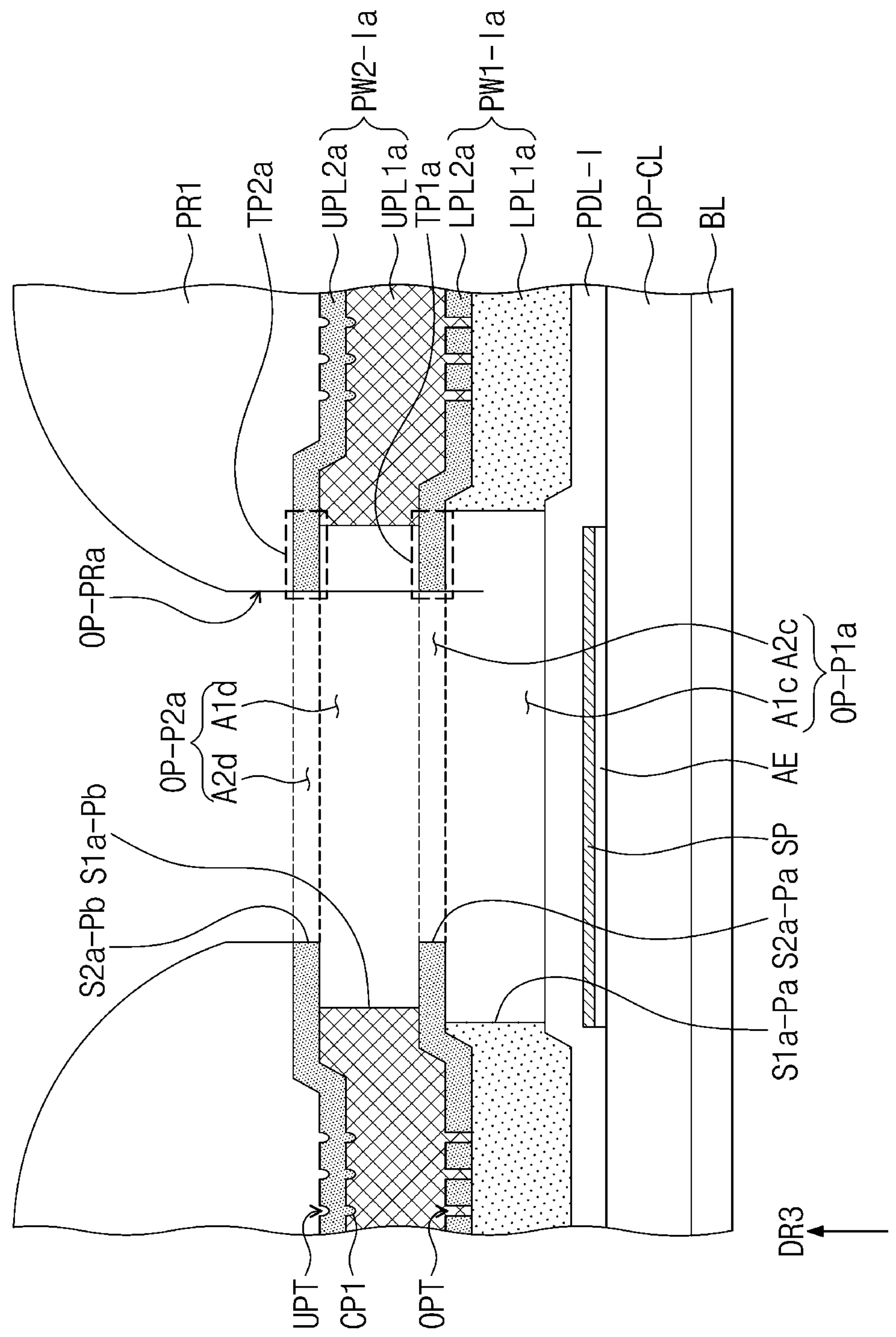

In an embodiment, the method may include providing, on the preliminary first upper layer UPL1, a preliminary second upper layer UPL2 (refer to FIG. 8G). The patterning may include a first etching of the preliminary first lower layer, the preliminary second lower layer, the preliminary first upper layer and the preliminary second upper layer, to provide an etched first lower layer (LPL1 in FIG. 8G), the second lower layer of the barrier wall (LPL2 in FIG. 8G), an etched first upper layer (UPL1 in FIG. 8G) and the second upper layer of the barrier wall (UPL2 in FIG. 8G, respectively. Referring to FIG. 8H, a second etching of the etched first lower layer (LPL1 in FIG. 8G) and the etched first upper layer (UPL1 in FIG. 8G) provides the first lower layer (LPL1 in FIG. 8H) and a first upper layer (UPL1 in FIG. 8H), respectively, of the barrier wall. FIGS. 9A and 9B may illustrate similar first and second etchings as those described above for FIGS. 8G and 8H.

Through the second etching process, the first upper side surface S1-Pb of the first upper layer UPL1 may be depressed inward when compared to the second upper side surface S2-Pb of the second upper layer UPL2. The second tip portion TP2 may be formed in the second barrier wall PW2 by a portion of the second upper layer UPL2 that protrudes from the first upper layer UPL1. In addition, the first lower side surface S1-Pa of the first lower layer LPL1 may be depressed inward when compared to the second lower side surface S2-Pa of the second lower layer LPL2. The first tip portion TP1 may be formed in the first barrier wall PW1 by a portion of the second lower layer LPL2 that protrudes from the first lower layer LPL1.

Referring to FIG. 8I, the display panel manufacturing method according to this embodiment may include a process of etching the preliminary pixel defining layer PDL-I to form the pixel defining layer PDL. The process of etching the preliminary pixel defining layer PDL-I may be performed by a dry etch process and may be performed by using the first photoresist layer PR1 as a mask. The light emitting opening OP-E corresponding to (or aligned with) the first and second barrier wall openings OP-P1 and OP-P2 may be formed in the pixel defining layer PDL. The first electrode may be exposed to outside the pixel defining layer PDL by the light emitting opening OP-E. Here, all of the sidewall of the various layers together defining the first and second barrier wall openings OP-P1 and OP-P2 and the light emitting opening OP-E may be exposed to outside the preliminary stacked structure shown in FIG. 8I.

Referring to FIG. 8J, the display panel manufacturing method according to this embodiment may include a process of etching the preliminary form of the sacrificial pattern SP. The process of etching the sacrificial pattern SP may be performed by a wet etch process and may be performed by using sidewalls defining the collective preliminary opening (OP-P1, OP-P2 and OP-E) and the first photoresist layer PR1 as a mask.

The sacrificial opening OP-S corresponding to the light emitting opening OP-E may be formed in the sacrificial pattern SP. At least a portion of the anode AE may be exposed from the sacrificial pattern SP and the pixel defining layer PDL by the sacrificial opening OP-S together with the light emitting opening OP-E.

The etching process of the sacrificial pattern SP may be performed in an environment in which the etch selectivity between the sacrificial pattern SP and the anode AE is high, and thus the anode AE may be prevented from being etched together with the preliminary sacrificial pattern. That is, since the sacrificial pattern SP having a higher etch rate than the anode AE is disposed between the pixel defining layer PDL and the anode AE, the anode AE may be prevented from being etched together with the preliminary sacrificial pattern layer and damaged during the etching process.

Referring to FIG. 8K, the display panel manufacturing method according to this embodiment may include a process of forming the emission pattern EP after removing the first photoresist layer PR1 (refer to FIG. 8J) and a process of forming the cathode CE.

Each of the process of forming the emission pattern EP and the process of forming the cathode CE may be performed by a deposition process. In an embodiment, the process of forming the emission pattern EP may be performed by a thermal evaporation process, and the process of forming the cathode CE may be performed by a sputtering process.

In the process of forming the emission pattern EP, a first material portion providing the emission pattern EP may be separated from a remainder of the emission material layer by the first tip portion TP1 (refer to FIG. 8H) formed by the first barrier wall PW1, and may be disposed in the light emitting opening OP-E and in the first barrier wall opening OP-P1. In the process of forming the emission pattern EP, a first-first preliminary dummy layer D11-I as a second material portion of the emission material layer is spaced apart from the emission pattern EP may be formed on the second barrier wall PW2. The first-first preliminary dummy layer D11-I may cover the second upper side surface S2-Pb. Furthermore, in an embodiment, in the process of forming the emission pattern EP, the second-first dummy layer D21 as a third material portion of the emission material layer may be formed on a portion of the second lower layer LPL2 which is exposed from the first upper layer UPL1. The second-first dummy layer D21 may cover the second lower side surface S2-Pa.

Here, the emission material layer is divided or disconnected at the various tip portions to form the material portions described above. That is, the emission pattern EP, the first-first preliminary dummy layer D11-I and the second-first dummy layer D21 may be in a same layer as each other, among layers disposed on the circuit element layer DP-CL.

In the process of forming the cathode CE, a first material portion providing the cathode CE may be separated from a remainder of the electrode material layer by the first tip portion TP1 (refer to FIG. 8H) formed in the first barrier wall PW1 and may be disposed in the light emitting opening OP-E and the first barrier wall opening OP-P1. The electrode material layer providing the cathode CE may be provided at a higher incidence angle than the emission material layer providing the emission pattern EP to thereby make contact with the first lower side surface S1-Pa of the first lower layer LPL1. In the process of forming the cathode CE, a first-second preliminary dummy layer D12-I as a second material portion of the electrode material layer is spaced part from the cathode CE may be formed on the second barrier wall PW2. Furthermore, in an embodiment, in the process of forming the cathode CE, the second-second dummy layer D22 as a third material portion of the electrode material layer may be formed on the second lower layer LPL2 exposed from the first upper layer UPL1. The anode AE, the emission pattern EP, and the cathode CE may constitute the light emitting element ED.

Although not illustrated, a process of forming a capping pattern on the cathode CE may be added. In this case, similarly to the cathode CE, a capping material layer providing the capping pattern may be separated by the first barrier wall and may be formed as a dummy pattern on the second barrier wall.

The first-first preliminary dummy layer D11-I and the first-second preliminary dummy layer D12-I may together form a first preliminary dummy pattern DMP1-I, and the first dummy opening OP-D1 may be formed in the first preliminary dummy pattern DMP1-I. The first dummy opening OP-D1 may be defined by inner surfaces of the first-first preliminary dummy layer D11-I and the first-second preliminary dummy layer D12-I. Each of the first-first preliminary dummy layer D11-I and the first-second preliminary dummy layer D12-I may include a plurality of depression patterns corresponding to the upper pattern UPT. Referring to FIG. 4 and FIG. 8K, for example, concentric depressions of the upper pattern UPT may be respectively provided around light emissive regions PXA.

The second-first dummy layer D21 and the second-second dummy layer D22 may together form the second dummy pattern DMP2, and the second dummy opening OP-D2 may be formed in the second dummy pattern DMP2. The second dummy opening OP-D2 may be defined by inner surfaces of the second-first dummy layer D21 and the second-second dummy layer D22.

Referring to FIG. 8L, the display panel manufacturing method according to this embodiment may include a process of forming a preliminary lower inorganic encapsulation pattern LIL-I.

The preliminary lower inorganic encapsulation pattern LIL-I may be formed through a deposition process. In an embodiment, the preliminary lower inorganic encapsulation pattern LIL-I may include an inorganic material, for example, silicon nitride ($SiN_x$). For example, the preliminary lower inorganic encapsulation pattern LIL-I may be formed through a chemical vapor deposition (CVD) process.

The preliminary lower inorganic encapsulation pattern LIL-I may cover the light emitting element ED. A first portion of the preliminary lower inorganic encapsulation pattern LIL-I may be disposed in the light emitting opening OP-E, the first barrier wall opening OP-P1, and the second barrier wall opening OP-P2. A second portion of the preliminary lower inorganic encapsulation pattern LIL-I may cover the first preliminary dummy pattern DMP1-I on the second barrier wall PW2. Specifically, the second portion of the preliminary lower inorganic encapsulation pattern LIL-I may extend from the sidewall at the first preliminary dummy pattern DMP1-I and along the upper surface thereof to make direct contact with the depression patterns formed on the first-first preliminary dummy layer D11-I and the first-second preliminary dummy layer D12-I on the second barrier wall PW2. The first portion and the second portion of the preliminary lower inorganic encapsulation pattern LIL-I may be connected to each other to provide a single inorganic material layer which is in the emissive opening and extends out of the emissive opening to be disposed adjacent to the emissive opening (e.g., on the stacked structure defining the emissive opening).

Referring to FIGS. 8L and 8M, the display panel manufacturing method according to this embodiment may include a process of forming a second photoresist layer PR2, a process of patterning the preliminary lower inorganic encapsulation pattern LIL-I to form the lower inorganic encapsulation pattern LIL and a process of patterning the first preliminary dummy pattern DMP1-I to form the first dummy pattern DMP1.

In the process of forming the second photoresist layer PR2, the second photoresist layer PR2 may be formed by forming a preliminary photoresist material layer and patterning the preliminary photoresist material layer by using a photo mask. Through the patterning process, the second photoresist layer PR2 may be formed in a pattern form overlapping the light emitting opening OP-E. Here, although not shown, the second photoresist pattern PR2 may cover the emissive opening and a portion of the stacked structure which is adjacent to and defines the emissive opening. An uppermost layer of the stacked structure may be exposed to outside the second photoresist pattern.

The process of patterning the preliminary lower inorganic encapsulation pattern LIL-I may be performed such that portions of the preliminary lower inorganic encapsulation pattern LIL-I that are exposed to outside the second photoresist pattern are removed, while a lower inorganic encapsulation patter remains at and around the emissive opening. In FIG. 8M, a corresponding anode AE of a corresponding light emitting element ED is in the emissive opening, while other anodes of other light emitting elements ED are spaced apart from the corresponding anode AE (refer to FIG. 5, for example).

In an embodiment, the second photoresist pattern exposes a planar area between light emissive regions PXA of an underlying layer, such as to overlap the remaining anodes other than the corresponding anode AE. Portions of a layer (e.g., the preliminary lower inorganic encapsulation pattern LIL-I) which are exposed from the second photoresist pattern at the planar area are removed such as by dry etching. For example, when a first material portion of the preliminary lower inorganic encapsulation pattern LIL-I corresponds to the first anode AE1 (refer to FIG. 5), a second material portion of the preliminary lower inorganic encapsulation pattern LIL-I that overlap the second and third anodes AE2 and AE3 and overlap the planar area at the peripheral region NPXA (refer to FIG. 5) may be removed. That is, the preliminary lower inorganic encapsulation pattern LIL-I may be disconnected between emissive regions PXA.

In FIG. 8M, the preliminary lower inorganic encapsulation pattern LIL-I has opposing ends corresponding to opposing sidewalls of the second photoresist pattern. Here, the portion of the preliminary lower inorganic encapsulation pattern LIL-I which overlaps the remaining anodes other than the corresponding anode AE and/or is disposed between emissive regions PXA is removed to form the opposing ends of the preliminary lower inorganic encapsulation pattern LIL-I. In an embodiment, the preliminary lower inorganic encapsulation pattern LIL-I may be disconnected at a location between adjacent emissive regions PXA, that is, at the opposing ends.

The lower inorganic encapsulation pattern LIL overlapping the corresponding light emitting opening OP-E may be formed from the patterned preliminary lower inorganic encapsulation pattern LIL-I. A first portion of the lower inorganic encapsulation pattern LIL may be disposed in the first and second barrier wall openings OP-P1 and OP-P2 and may cover the light emitting element ED, and a second portion of the lower inorganic encapsulation pattern LIL may be disposed on the second barrier wall PW2.

In embodiments, one or more layers underlying the patterned portion of the preliminary lower inorganic encapsulation pattern LIL-I may also be removed such as by etching using the second photoresist pattern. In an embodiment, the process of patterning the first preliminary dummy pattern DMP1-I may be performed such that portions of the first-first preliminary dummy layer D11-I and the first-second preliminary dummy layer D12-I that overlap the remaining anodes other than the corresponding anode AE are removed by dry etching the first-first preliminary dummy layer D11-I and the first-second preliminary dummy layer D12-I. For example, when the first-first preliminary dummy layer D11-I and the first-second preliminary dummy layer D12-I correspond to the first anode AE1 (refer to FIG. 5), portions of the first-first preliminary dummy layer D11-I and the first-second preliminary dummy layer D12-I that overlap the second and third anodes AE2 and AE3 (refer to FIG. 5) may be removed. Here, the opposing ends of the various etched layers (LIL-I, D12-I and D11-I) may each be disposed at a position outside of the depressions of the upper pattern UPT, that is, further from the emissive opening than the upper pattern UPT. The opposing ends of the etched layers may be aligned with each other, without being limited thereto.

In embodiments, one or more of the upper layers such as LIL-I and DMP1-I may not removed such as by etching using the second photoresist pattern. Such upper layers may remain to overlap the remaining anodes other than the corresponding anode AE and/or remain to be disposed between emissive regions PXA (refer to FIGS. 5, 6 and 8N, for example).

The first-first dummy layer D11 and the first-second dummy layer D12 overlapping the corresponding light emitting opening OP-E may be formed from the patterned the first-first preliminary dummy layer D11-I and the first-second preliminary dummy layer D12-I, and thus the first dummy pattern DMP1 including the first-first dummy layer D11 and the first-second dummy layer D12 may be formed (refer to FIGS. 7A and 7B). The first dummy pattern DMP1 may have a closed-line shape surrounding the corresponding emissive region PXA (refer to FIG. 4) on the plane. FIG. 4 shows depressions of the upper pattern UPT in the first dummy pattern DMP1 are shown relative to the corresponding emissive region PXA, Referring to FIG. 8N, the display panel manufacturing method according to this embodiment may include a process of completing the display panel DP by forming the organic encapsulation film OL and the upper inorganic encapsulation film UIL after removing the second photoresist layer PR2 (refer to FIG. 8M). The organic encapsulation film OL may be formed by applying an organic material using an inkjet method, but is not limited thereto. The organic encapsulation film OL provides a flat upper surface, to planarize the cross-sectional profile formed by the underlying stacked structure. The upper inorganic encapsulation film UIL may be formed by depositing an inorganic material. Accordingly, the display panel DP including the base layer BL, the circuit element layer DP-CL, the display element layer DP-OLED, and the thin film encapsulation layer TFE may be formed (refer to FIGS. 4-6, 7A and 7B).

A process of forming first barrier wall openings, second barrier wall openings, and light emitting openings corresponding to emissive regions emitting different color light from that the respective light emissive region in FIGS. 8A to 8N, in the first barrier wall PW1, the second barrier wall PW2, and the pixel defining layer PDL, respectively, a process of forming light emitting elements that provide the different colored lights at the different emissive regions, and a process of forming lower inorganic encapsulation patterns covering the light emitting elements ED of the different emissive regions may be additionally performed between the process of forming the lower inorganic encapsulation pattern LIL and the completing the display panel DP. Accordingly, the display panel DP that includes a plurality of light emitting elements such as the first to third light emitting elements ED1, ED2, and ED3, a plurality of dummy patterns such as the first-first dummy pattern DMP11, the first-second dummy pattern DMP12, and the first-third dummy pattern DMP13, the second-first dummy pattern DMP21, the second-second dummy pattern DMP22, and the second-third dummy pattern DMP23, and a plurality of encapsulation patterns such as the first to third lower inorganic encapsulation patterns LIL1, LIL2, and LIL3 as illustrated in FIG. 5 may be formed.

The first upper layer UPL1 and the second upper layer UPL2 of the display panel DP according to an embodiment of the present disclosure may include an inorganic material. Specifically, the second upper layer UPL2 may include silicon oxide ($SiO_2$). In this case, the second upper layer UPL2 may have a higher clastic modulus value than when the second upper layer UPL2 includes titanium (Ti). Accordingly, bending of the second tip portion TP2 defined in the second upper layer UPL2 may be reduced or prevented. In addition, as the first upper layer UPL1 and the second upper layer UPL2 include an inorganic material, the interfacial adhesive force between the first upper layer UPL1 and the lower inorganic encapsulation pattern LIL and the interfacial adhesive force between the second upper layer UPL2 and the lower inorganic encapsulation pattern LIL may be increased, and infiltration of moisture into the light emitting element ED may be prevented.

The first lower layer LPL1 of the display panel DP according to an embodiment of the present disclosure and the second lower layer LPL2 which is electrically connected with the first lower layer LPL1 through the plurality of opening patterns OPT may include molybdenum (Mo). Molybdenum (Mo) may have high conductivity, and an oxide film may not be formed on a surface thereof. Accordingly, as the first lower layer LPL1 includes molybdenum (Mo), the cathode CE may be easily electrically connected with the first lower layer LPL1. Thus, the common cathode voltage may be uniformly provided across the emissive regions PXA-R, PXA-G, and PXA-G (refer to FIG. 5). Accordingly, the display panel DP having reliability may be provided.

According to an embodiment of the present disclosure, the second upper layer UPL2 may include, at the upper surface US thereof, the upper pattern UPT corresponding to the plurality of opening patterns OPT. In this case, the contact area by which the first dummy pattern DMP1 is brought into contact with the upper surface US of the second upper layer UPL2 may be increased as compared with when the upper pattern UPT is not formed at the upper surface US of the second upper layer UPL2. Accordingly, even though moisture infiltrates between the first dummy pattern DMP1 and the lower inorganic encapsulation pattern LIL, a path along which the infiltrating moisture is moveable along the first and second barrier walls PW1 and PW2 to the portion where the light emitting element ED is disposed may be lengthened, and thus the moisture may be prevented from infiltrating into the light emitting element ED.

FIGS. 9A and 9B are sectional views illustrating some of processes of a display panel manufacturing method according to an embodiment of the present disclosure. In describing the display panel manufacturing method with reference to FIGS. 9A and 9B, components identical/similar to the components described with reference to FIGS. 1 to 7B will be assigned with identical/similar reference numerals, and repetitive descriptions will be omitted.

FIG. 9A is a view illustrating a first etching process of firstly etching the first lower layer LPL1*a*, the second lower layer LPL2*a*, the first upper layer UPL1*a*, and the second upper layer UPL2*a* in a process of patterning a first preliminary barrier wall layer PW1-Ia and a second preliminary barrier wall layer PW2-Ia.

Referring to FIG. 9A, in the first etching process, a second preliminary barrier wall opening OP-P2Ia (or, a preliminary upper barrier wall opening) may be formed in the second preliminary barrier wall layer PW2-Ia by using a first photoresist layer PR1 as a mask. The first etching process may be performed by a dry etch process.

Each of the second lower layer LPL2*a* and the second upper layer UPL2*a* may include an inorganic material. For example, each of the second lower layer LPL2*a* and the second upper layer UPL2*a* may include at least one of silicon nitride ($SiN_x$), silicon oxide ($SiO_2$), silicon oxynitride (SiON) and aluminum oxide ($AL_2O_3$). According to an embodiment of the present disclosure, the second lower layer LPL2*a* and the second upper layer UPL2*a* may include the same material. As the second lower layer LPL2*a* and the second upper layer UPL2*a* include the same material, the etch rates of the second lower layer LPL2*a* and the second upper layer UPL2*a* may be equal to each other.

The first etching process in this embodiment may be performed in an environment in which the etch selectivity between the second lower layer LPL2*a* and the second upper layer UPL2*a* is substantially the same. Specifically, as the etch rate of the second upper layer UPL2*a* by an etching solution is equal to the etch rate of the second lower layer LPL2*a*, the inner surface of the second upper layer UPL2*a* and the inner surface of the second lower layer LPL2*a* may be arranged side by side in the third direction DR3.

As illustrated in FIG. 9B, a process of patterning the first lower layer LPL1*a* and the first upper layer UPL1*a* may include a second etching process of secondly etching the first lower layer LPL1*a* and the first upper layer UPL1*a*. In the second etching process, a second barrier wall opening OP-P2*a* (or, an upper barrier wall opening) may be formed from the second preliminary barrier wall opening OP-P2Ia by using the first photoresist layer PR1 as a mask. The second etching process may be performed by a dry etch process or a wet etch process. For example, in the second etching process, the dry etch process may be performed by using hydrogen fluoride, and the wet etch process may be performed by using bromine water. The second barrier wall opening OP-P2*a* may include two volume regions directly adjacent to each other along the thickness direction. Through the patterning process, a photo opening OP-PRa overlapping the anode AE may be formed in the first photoresist layer PR1.

The second etching process in this embodiment may be performed in an environment in which the etch selectivity between the first lower and upper layers LPL1*a* and UPL1*a* and the second lower and upper layers LPL2*a* and UPL2*a* is high. Accordingly, the inner surface of the second barrier wall PW2*a* that defines the second barrier wall opening OP-P2*a* and the inner surface of the first barrier wall PW1*a* that defines the first barrier wall opening OP-P1*a* may have an undercut shape on the section. Specifically, the first upper layer UPL1*a* and the first lower layer LPL1*a* may be mainly etched since the etch rate of the first upper layer UPL1*a* by an etching solution is higher than the etch rate of the second upper layer UPL2*a* and the etch rate of the first lower layer LPL1*a* is higher than the etch rate of the second lower layer LPL2*a*. In this case, depending on conditions of the second etching process, the second lower layer LPL2*a* and the second upper layer UPL2*a* may be partially etched together with the first lower layer LPL1*a*, and the first upper layer UPL1*a*, or may not be etched.

When the second etching process is completed, the first lower layer LPL1*a* may include the first lower side surface S1*a*-Pa that defines the first lower region A1*c* of the first barrier wall opening OP-P1*a*, and the second lower layer LPL2*a* may include the second lower side surface S2*a*-Pa that defines the second lower region A2*c* of the first barrier wall opening OP-P1*a*. Furthermore, the first upper layer UPL1*a* may include the first upper side surface S1*a*-Pb that defines the first upper region A1*d* of the second barrier wall opening OP-P2*a*, and the second upper layer UPL2*a* may include the second upper side surface S2*a*-Pb that defines the second upper region A2*d* of the second barrier wall opening OP-P2*a*.

Through the second etching process, the first upper side surface S1*a*-Pb of the first upper layer UPL1*a* may be depressed inward when compared to the second upper side surface S2*a*-Pb of the second upper layer UPL2*a*. The second tip portion TP2*a* may be formed in the second barrier wall PW2*a* by a portion of the second upper layer UPL2*a* that protrudes from the first upper layer UPL1*a*. In addition, the first lower side surface S1*a*-Pa of the first lower layer LPL1*a* may be depressed inward when compared to the second lower side surface S2*a*-Pa of the second lower layer LPL2*a*. The first tip portion TP1*a* may be formed in the first barrier wall PW1*a* by a portion of the second lower layer LPL2*a* that protrudes from the first lower layer LPL1*a*.

Each of the first lower layer LPL1*a* and the first upper layer UPL1*a* may include a conductive material. For example, each of the first lower layer LPL1*a* and the first upper layer UPL1*a* may include a metallic material, an alloy material, or metal nitride. According to an embodiment of the present disclosure, the first lower layer LPL1*a* and the first upper layer UPL1*a* may include different materials. Specifically, the first upper layer UPL1*a* may include at least one of aluminum (Al) and molybdenum (Mo). The first lower layer LPL1*a* may include an aluminum (Al) alloy when the first upper layer UPL1*a* includes aluminum (Al) and may include a molybdenum (Mo) alloy when the first upper layer UPL1*a* includes molybdenum (Mo).

As the first lower layer LPL1*a* and the first upper layer UPL1*a* include different materials, the etch rates of the first lower layer LPL1*a* and the first upper layer UPL1*a* may differ from each other in the second etching process, and therefore the width by which the first upper side surface S1*a*-Pb is depressed from the second upper side surface S2*a*-Pb may differ from the width by which the first lower side surface S1*a*-Pa is depressed from the second lower side surface S2*a*-Pa. Specifically, the width by which the first lower side surface S1*a*-Pa is depressed from the second lower side surface S2*a*-Pa may be greater than the width by which the first upper side surface S1*a*-Pb is depressed from the second upper side surface S2*a*-Pb. In the present disclosure, as the width by which the first lower side surface S1*a*-Pa is depressed from the second lower side surface S2*a*-Pa is formed to be large, the length of the lower surface of the second lower layer LPL2*a* making contact with the lower inorganic encapsulation pattern LIL may be increased. Accordingly, a moisture infiltration path to the light emitting element ED (refer to FIG. 8N) may be lengthened. Thus, infiltration of moisture into the light emitting element ED may be prevented, and the display panel DP (refer to FIG. 8N) having improved process reliability and reduced defects may be provided.

Subsequent processes are the same as those illustrated in FIGS. 8I to 8N and will be omitted.

In an embodiment, a display panel DP includes a pixel defining layer PDL in which a light emitting opening OP-E is defined, a barrier wall (PW1 and PW2, together) which is on the pixel defining layer PDL and is electrically conductive, the barrier wall including a conductive layer (LPL1 together with UPL1 which is electrically conductive and includes a plurality of conductive side surfaces closest to the light emitting opening OP-E, a plurality of inorganic layers (LPL2 and UPL2) including a plurality of inorganic side surfaces closest to the light emitting opening OP-E, the plurality of conductive side surfaces and the plurality or inorganic side surfaces together defining a barrier wall opening (at S2-Pb, S1-Pb, S2-Pa and S1-Pa, for example) of the barrier wall which corresponds to the light emitting opening OP-E, and each of the plurality of inorganic layers (at TP1 and TP2) protruding further than each of the conductive side surfaces, at the barrier wall opening, and a light emitting element ED in the light emitting opening OP-E and electrically connected to the barrier wall at a conductive side surface (S1-Pa) among the plurality of conductive side surfaces (S1-Pa and S1-Pb together) of the barrier wall.

The display panel DP may further include an organic material layer and an electrode material layer on the pixel defining layer PDL. The light emitting element ED comprises a first electrode AE, an emission pattern EP and a second electrode CE in the light emitting opening OP-E. The organic material layer defines the emission pattern EP of the light emitting element and an organic material pattern (D21 and D11) which covers each of the plurality of inorganic side surfaces (at TP1 and TP2, and the electrode material layer defines the second electrode CE of the light emitting element and an electrode material pattern (D22 and D21) which covers each of the plurality of inorganic side surfaces.

Referring to FIG. 7A, for example, an inorganic layer (UPL2) which is furthest from the pixel defining layer PDL among the plurality of inorganic layers (UPL2 and LPL2) protrudes further from the each of the conductive side surfaces (S1-Pb and S1-Pa) than a remainder of the plurality of inorganic layers.

Referring to FIGS. 9A and 9B together with FIG. 7B, for example, at the barrier wall opening the plurality of conductive side surfaces of the conductive layer includes a first side surface (S1-Pa) and a second side surface (S1-Pb) which is further from the pixel defining layer PDL than the first side surface, a thickness portion of the conductive layer (e.g., at A1*c* in FIG. 9B, for example) which defines the second side surface protrudes further than the first side surface, and the light emitting element ED is connected to the barrier wall at the first side surface of the conductive layer.

According to the present disclosure, a material layer of the emission patterns EP may be subjected to patterning without a metal mask. Accordingly, the display panel DP may have improved process reliability and may easily implement high resolution.

According to the present disclosure, the second lower layer of the first barrier wall and the second upper layer of the second barrier wall may include an inorganic material. Accordingly, bending of the tip portion defined in the second upper layer may be reduced or prevented. The second lower layer and the second upper layer may include the same material as the lower inorganic encapsulation pattern. Accordingly, the interfacial adhesive force between the second lower layer and the lower inorganic encapsulation pattern and the interfacial adhesive force between the second upper layer and the lower inorganic encapsulation pattern may be increased, and infiltration of moisture into the light emitting element may be prevented.

According to the present disclosure, the first lower layer of the first barrier wall and the first upper layer of the second barrier wall electrically connected with the first lower layer through the plurality of opening patterns may include molybdenum (Mo). As the first lower layer includes molybdenum (Mo), the cathode may be easily electrically connected with the first lower layer, and thus the common cathode voltage may be uniformly provided for the emissive regions. Accordingly, the display panel having reliability may be provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display panel comprising:
- a pixel defining layer in which a light emitting opening is defined;
- a barrier wall which is on the pixel defining layer and is electrically conductive, the barrier wall comprising:
  - a first lower layer which is electrically conductive;
  - a first upper layer which faces the first lower layer and is electrically conductive;
  - a second lower layer between the first lower layer and the first upper layer, the second lower layer defining an opening therein; and
  - the first upper layer electrically connected to the first lower layer through the opening of the second lower layer; and
- a light emitting element comprising:
  - a first electrode, an emission pattern and a second electrode in the light emitting opening; and
  - the second electrode contacting the first lower layer of the barrier wall.

2. The display panel of claim 1, wherein
- the first lower layer includes a first lower side surface,
- the second lower layer includes a second lower side surface,
- the first lower side surface and the second lower side surface define portions of a barrier wall opening of the barrier wall which corresponds to the light emitting opening, and
- the first lower side surface is recessed from the second lower side surface in a direction away from the light emitting opening.

3. The display panel of claim 2, wherein the second lower layer includes an inorganic material.

4. The display panel of claim 3, further comprising:
- the second lower layer further includes an exposed lower surface extended from the first lower side surface which is recessed, and
- an inorganic pattern covering the second electrode, the first lower side surface and an entirety of the exposed lower surface.

5. The display panel of claim 2, wherein the second electrode contacts the first lower side surface.

6. The display panel of claim 2, wherein the barrier wall further includes a second upper layer which faces the second lower layer with the first upper layer therebetween.

7. The display panel of claim 6, wherein the first lower layer and the first upper layer include a same metal material.

8. The display panel of claim 7, wherein each of the first lower layer and the first upper layer includes molybdenum.

9. The display panel of claim 6, wherein
- the first upper layer includes a first upper side surface,
- the second upper layer includes a second upper side surface,
- the first upper side surface and the second upper side surface define portions of the barrier wall opening, and
- the first upper side surface is recessed from the second upper side surface in the direction away from the light emitting opening.

10. The display panel of claim 9, wherein
- the second lower layer defines a first tip portion of the barrier wall which protrudes further than the first lower side surface, and
- the second upper layer defines a second tip portion of the barrier wall which protrudes further than the first upper side surface.

11. The display panel of claim 10, wherein the second upper layer includes an inorganic material.

12. The display panel of claim 11, wherein the second lower layer and the second upper layer include different inorganic materials from each other.

13. The display panel of claim 12, wherein a length by which the second tip portion protrudes from the first upper side surface is greater than a length by which the first tip portion protrudes from the first lower side surface.

14. The display panel of claim 10, wherein the first lower layer and the first upper layer include different metallic materials from each other.

15. The display panel of claim 14, wherein the first lower side surface is recessed from the first upper side surface in the direction away from the light emitting opening.

16. The display panel of claim 15, wherein a length by which the first tip portion protrudes from the first lower side surface is greater than a length by which the second tip portion protrudes from the first upper side surface.

17. The display panel of claim 14, wherein the first upper layer includes aluminum, and the first lower layer includes an aluminum alloy.

18. The display panel of claim 17, wherein each of the second lower layer and the second upper layer includes titanium.

19. The display panel of claim 10, further comprising:

the first tip portion includes an exposed lower surface of the second lower layer which is extended from the first lower side surface, the second tip portion includes an exposed lower surface of the second upper layer which is extended from the first upper side surface, and an inorganic pattern covering the second electrode, an entirety of the first lower side surface, an entirety of the exposed lower surface of the first tip portion and an entirety of the exposed lower surface of the second tip portion.

20. The display panel of claim 6, wherein the second upper layer defines a depression recessed from an upper surface of the second upper layer, the depression corresponding to the opening defined in the second lower layer.

21. The display panel of claim 1, further comprising in the light emitting opening of the pixel defining layer, a sacrificial pattern which is on the first electrode and in which a sacrificial opening is defined, the sacrificial opening corresponding to the light emitting opening, wherein the pixel defining layer covers the sacrificial pattern.

* * * * *